US012571089B2

(12) United States Patent
Rouleau et al.

(10) Patent No.: US 12,571,089 B2
(45) Date of Patent: Mar. 10, 2026

(54) REMOTE LASER-BASED SAMPLE HEATER WITH SAMPLE EXCHANGE TURRET

(71) Applicant: UT-Battelle, LLC, Oak Ridge, TN (US)

(72) Inventors: Christopher Rouleau, Knoxville, TN (US); Sumner Harris, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 108 days.

(21) Appl. No.: 18/417,567

(22) Filed: Jan. 19, 2024

(65) Prior Publication Data

US 2025/0066903 A1 Feb. 27, 2025

(51) Int. Cl.
　C23C 14/54 (2006.01)
　C23C 14/50 (2006.01)
(52) U.S. Cl.
　CPC ............ C23C 14/541 (2013.01); C23C 14/50 (2013.01)
(58) Field of Classification Search
　CPC .... C23C 14/0036; C23C 14/34; C23C 14/505
　See application file for complete search history.

(56) References Cited

U.S. PATENT DOCUMENTS 5,395,704 A * 3/1995 Barnett ............... H01M 4/9066
　　　　　　　　　　　　　　　　　429/486
6,379,747 B1 * 4/2002 Sato ..................... C23C 14/044
　　　　　　　　　　　　　　　　　427/598

6,491,759 B1 * 12/2002 Christen .............. B01J 19/0046
　　　　　　　　　　　　　　　　　118/723 VE
2019/0382882 A1 * 12/2019 Grundmann ........ C23C 16/0209
2021/0133989 A1 * 5/2021 Bhattacharyya ....... G06V 10/82

OTHER PUBLICATIONS

<https://www.lesker.com/newweb/sample_manipulation/tapseries.cfm>.
<https://www.lesker.com/newweb/sample_manipulation/linear-telescopic-transfer-arm.cfm>.
<https://www.lesker.com/newweb/sample_manipulation/sample-parking-stage.cfm>.
<https://www.lesker.com/newweb/sample_manipulation/rtta-overview.cfm>.
<https://www.surface-tec.com/pldlaserheater.php>.
<https://neocera.com/products/laser-substrate-heater/>.

(Continued)

*Primary Examiner* — Parviz Hassanzadeh
*Assistant Examiner* — Nathan K Ford
(74) *Attorney, Agent, or Firm* — Fox Rothschild LLP

(57) ABSTRACT

A physical vapor deposition system includes a hermetic chamber with an open interior and an access port. A heating laser source is adapted to direct a heating laser beam into the open interior. A substrate holder assembly comprises a substrate platform positioned in the open interior and has a plurality of substrate securing stations and a motor for moving the platform. A target assembly retains a target within the open interior. A control system can include a processor for controlling the operation of the heating laser beam and the motor. A shielding member with an opening shields queued substrate securing stations from the physical vapor deposition vapors and allows only the substrate being heated by the heating laser beam to be contacted by the physical vapor deposition vapors. A method of performing physical vapor deposition and a substrate holder assembly also are disclosed.

9 Claims, 23 Drawing Sheets

(56)  References Cited

OTHER PUBLICATIONS

PLD and PED Components Datasheet, Neocera.

Surface Laser Heater Datasheet.

Harris, et al. Autonomous synthesis of thin film materials with pulsed laser deposition enabled by in situ spectroscopy and automation, Center for Nanophase Materials Sciences, Oak Ridge National Laboratory, Oak Ridge, Tennessee 37831, United States.

Radial Sample Distribution, RTTA 3-Axis Technical Datasheet, UHV Design Ltd.

Linear Telescopic Transfer Arm Technical Datasheet, UHV Design Ltd.

Sample Parking Stage—Linear and Rotary Manipulator Technical Datasheet, Kurt J. Lesker Company.

Linear With Rotatable Inner Shaft & Lock, Triple Axis PowerProbe (TAPP Series) Technical Datasheet, UHV Design Ltd.

\* cited by examiner

REMOTE LASER-BASED SAMPLE HEATER WITH SAMPLE EXCHANGE TURRET

STATEMENT REGARDING FEDERALLY SPONSORED RESEARCH AND DEVELOPMENT

This invention was made with government support under Contract No. DE-AC05-000R22725 awarded by the U.S. Department of Energy. The government has certain rights in this invention.

FIELD OF THE INVENTION

The present invention relates generally to physical vapor deposition systems and methods.

BACKGROUND OF THE INVENTION

Physical vapor deposition (PVD) is a process wherein a material of interest or target is energized in some fashion so as to transition the target from a condensed phase to a vapor phase, whereupon the target material will recondense on a substrate of interest to coat that substrate with the target material. PVD processes have significant utility in industrial and research applications. In a pulsed laser deposition (PLD) workflow (and all PVD workflows in general), a bottleneck can exist that is dependent on human action, which limits their utility in autonomous experiments. This bottleneck is the exchange of new growth substrates for subsequent experiments. Typically, a human must vent the deposition chamber to atmospheric pressure, mount a fresh substrate to the substrate heater, and pump the chamber back down to vacuum pressure. This process takes several hours to complete and is done one-at-a-time which limits the number of samples a human can make in a typical workday.

SUMMARY OF THE INVENTION

A physical vapor deposition system includes a hermetic chamber with an open interior and an access port, and a heating laser source adapted to direct a laser beam into the open interior. A sample substrate holder assembly includes a substrate platform positioned in the open interior and having a plurality of substrate securing stations for securing sample substrates, and a motor for moving the platform such that each of the substrate securing stations can be positioned to intercept the heating laser beam. A target assembly retains a target within the open interior. A control system includes a processor for controlling the operation of the heating laser beam and the motor.

The substrate holder can be planar and the substrate securing stations can be coplanar. The substrate holder can be configured as a wheel. The wheel rotates about an axis that is parallel to the heating laser beam. The wheel has a diameter and the access port has a diameter, and the diameter of the wheel can be less than the diameter of the access port. The motor drives a transmission system to rotate the wheel.

The physical vapor deposition system can further include a shielding member for shielding queued substrate securing stations from the physical vapor deposition vapors. The shielding member can include an opening for permitting a substrate secured to a substrate securing station that is aligned with the opening to be contacted by the physical vapor deposition vapors.

A sealing support member can be provided for sealing the access port and supporting the substrate platform within the hermetic chamber, the sealing support member being detachable from the access port. The sealing support member can include a laser transmissive portion aligned with the laser beam and the opening of the shielding member for permitting the laser beam to strike a substrate securing station aligned with the heating laser transmissive portion and the opening of the shielding member.

The energy source can vary. The energy source can be at least one selected from the group consisting of a pulsed or continuous wave laser; resistive heating element in boat, filament, or crucible form; cathodic arc; pulsed or continuous electron beam; RF, DC, pulsed, or ion beam sputtering; and RF or DC plasma discharge. Other energy sources are possible.

The substrate securing stations can include removable substrate securing plates capable of securing a substrate and being detachably connectable to the substrate platform. The substrate securing plates can include thermal break openings. The substrate securing plates can also include a susceptor region. The susceptor when struck by the laser beam enhances the translation of energy from the laser beam to the substrate securing plates to heat the secured substrate.

The physical vapor deposition system can include sensors for sensing characteristics of the physical vapor deposition process. The physical vapor deposition system can include a pyrometer for sensing the temperature of the substrate securing plates. Other sensors are possible.

The physical vapor deposition system can include a heating laser beam tube, a motor for rotating the heating laser beam tube, and a motor for raising and lowering the heating laser beam tube. An electron beam source and a detector can be provided for performing diagnostics on the starting substrate and subsequent deposited layers.

A method of performing physical vapor deposition includes the steps of providing a hermetic chamber with an open interior and an access port, and providing a heating laser source adapted to direct a laser beam into the open interior.

A substrate holder assembly comprising a substrate platform having a plurality of substrate securing stations is positioned within the open interior. A motor is provided for moving the platform such that each of the substrate securing stations can be positioned to intercept the heating laser beam. A target is provided on a target assembly within the open interior. A substrate securing station is positioned so as to be intercepted by the heating laser beam. An energy source is operated to energize a target held by the target assembly, whereby target material will be vaporized, while directing the laser beam at the substrate securing station so as to heat the substrate. A control system comprising a processor to cease operation of the heating laser beam, operate the motor to move the substrate platform to move another substrate securing station into the path of the heating laser beam, and then turn on the heating laser beam to generate a heated substrate.

The substrate securing stations can include removable substrate securing plates, and the method can include the step of securing a substrate to a substrate securing plate and securing the substrate securing plate to the substrate platform prior to physical vapor deposition and removing the substrate securing plate and the substrate after physical vapor deposition has been performed on the substrate. The substrate platform can be planar and the substrate securing stations can be coplanar. The method can include the steps of configuring the substrate platform as a wheel, and rotating the wheel about an axis that is parallel to the laser heating beam. The wheel has a diameter and the access port has a diameter, and the diameter of the wheel can be less than the diameter of the access port, and the method can further include the steps of passing the wheel through the access port before and then after all physical vapor deposition steps are completed.

The method can include the step of sensing characteristics of the physical vapor deposition system and process. The method can include the step of providing a pyrometer and using the pyrometer to control the heating laser beam and thereby the temperature of the heated substrate.

The method can include the step of providing an energy source for the physical vapor deposition. The energy source for the physical vapor deposition can be at least one selected from the group consisting of a pulsed or continuous wave laser; resistive heating element in boat, filament, or crucible form; cathodic arc; pulsed or continuous electron beam; RF, DC, pulsed, or ion beam sputtering; and RF or DC plasma discharge.

The method can further include the step of providing a shielding member. The shielding member is used to shield queued substrate securing stations from the vaporized target material. The shielding member can include a vapor transmissive portion. The vapor transmissive portion can be aligned with the heating laser beam. The method can include positioning a substrate securing station and substrate adjacent to the laser transmissive portion such that the substrate securing station and substrate will be heated by the laser during the physical vapor deposition.

The method can include the step of using the control system to control operation of an energy source for the target. The method can include the steps of providing an electron beam and a detector, and a motor for raising and lowering a heating laser beam tube and a motor for rotating the heating laser beam tube. A substrate is positioned on a fixture attached to an end of the heating laser beam tube. Physical vapor deposition is performed to deposit a layer. The electron beam, detector, motor for rotating the heating laser beam tube, and motor for raising and lower the heating laser beam tube are used to detect physical characteristics of the starting substrate surface and subsequently deposited layer.

A substrate holder assembly is provided for a physical vapor deposition system having a hermetic chamber with an access port. The substrate holder assembly includes a substrate platform positioned in the open interior and having a plurality of substrate securing stations, and a motor for moving the platform such that each of the substrate securing stations can be positioned to intercept the heating laser beam. The substrate holder assembly also includes a support. The support is connectable to the access port so as to hermetically seal the access port and connected to the substrate platform to support the substrate platform in the open interior.

The support can include a window for transmitting a laser beam through the window and to a substrate securing station. The substrate securing stations can include removable substrate securing plates capable of securing a substrate and being detachably connectable to the substrate platform. The substrate securing plates can include a susceptor region. The susceptor when struck by the laser beam enhances translation of the energy from the laser beam to the substrate securing plates to heat the substrate. The substrate securing plates can also include a thermal break opening.

BRIEF DESCRIPTION OF THE DRAWINGS

There are shown in the drawings embodiments that are presently preferred and it being understood that the invention is not limited to the arrangements and instrumentalities shown, wherein.

DETAILED DESCRIPTION OF THE INVENTION

Figure 1:
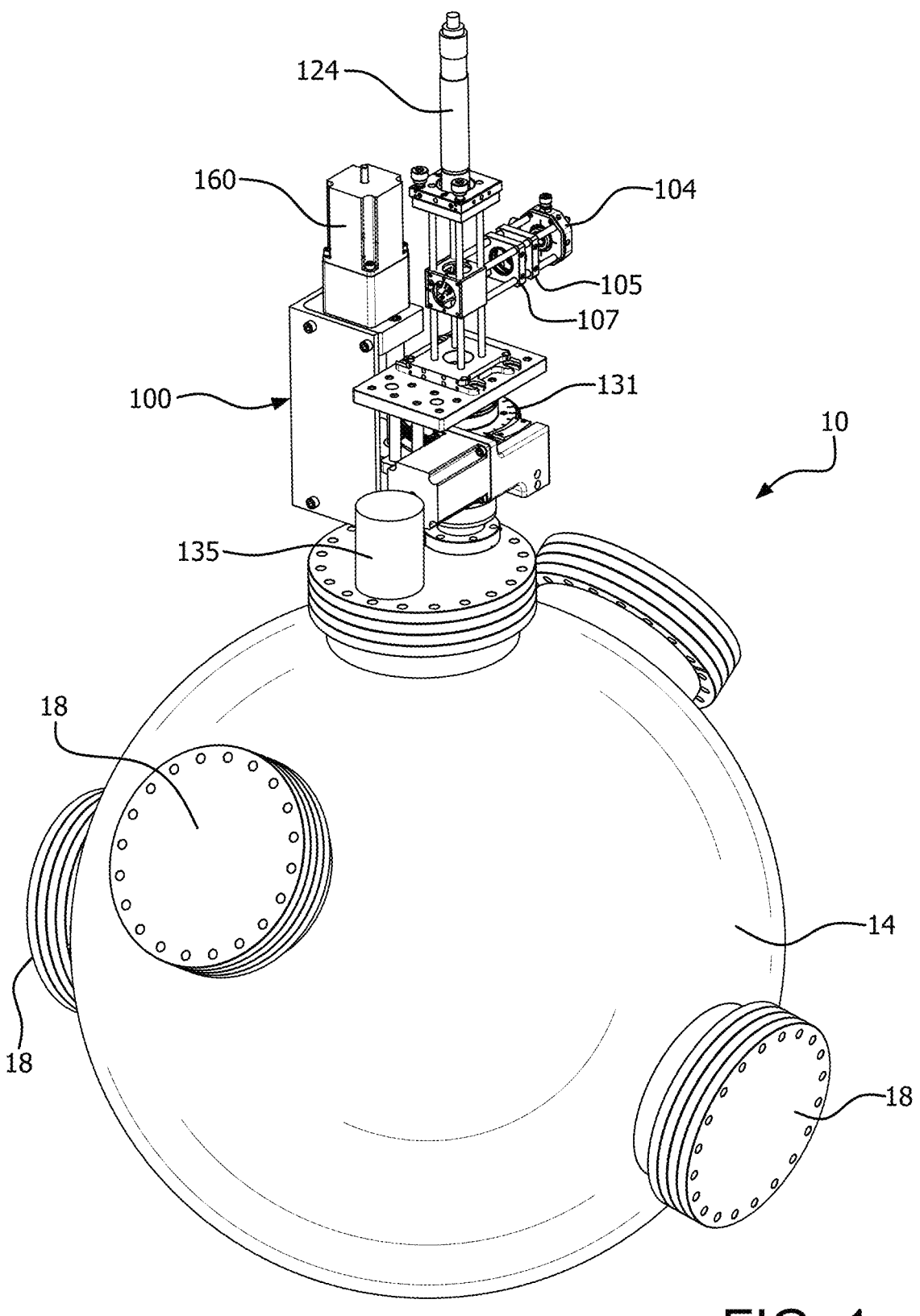
FIG. 1 is a perspective view of a physical vapor deposition system according to the invention.
Figure 2:
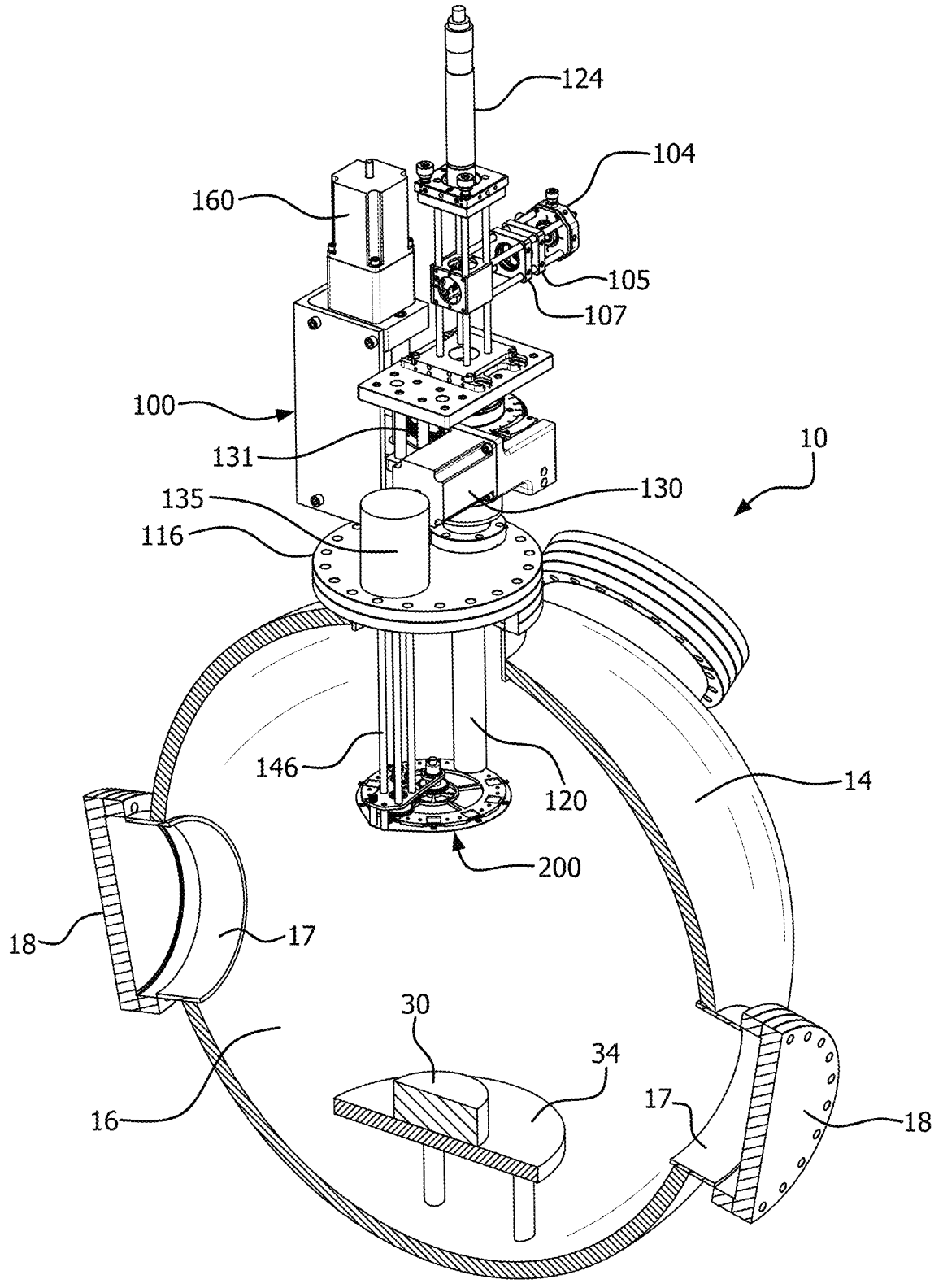
FIG. 2 is a cross-section of the physical vapor deposition system of FIG. 1.
Figure 3:
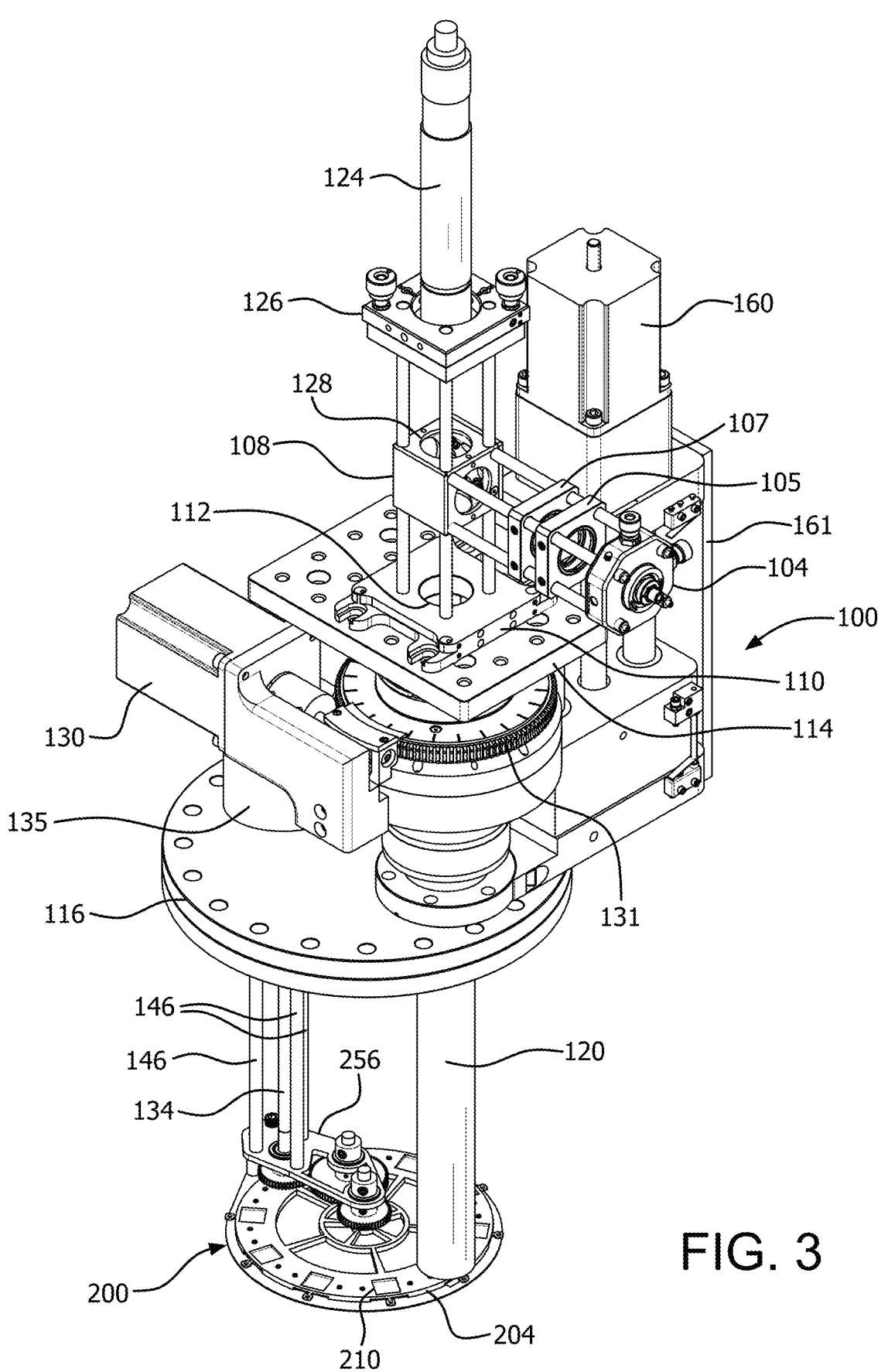
FIG. 3 is a front perspective view of the remote laser-based sample heater with sample exchange turret assembly.
Figure 4:
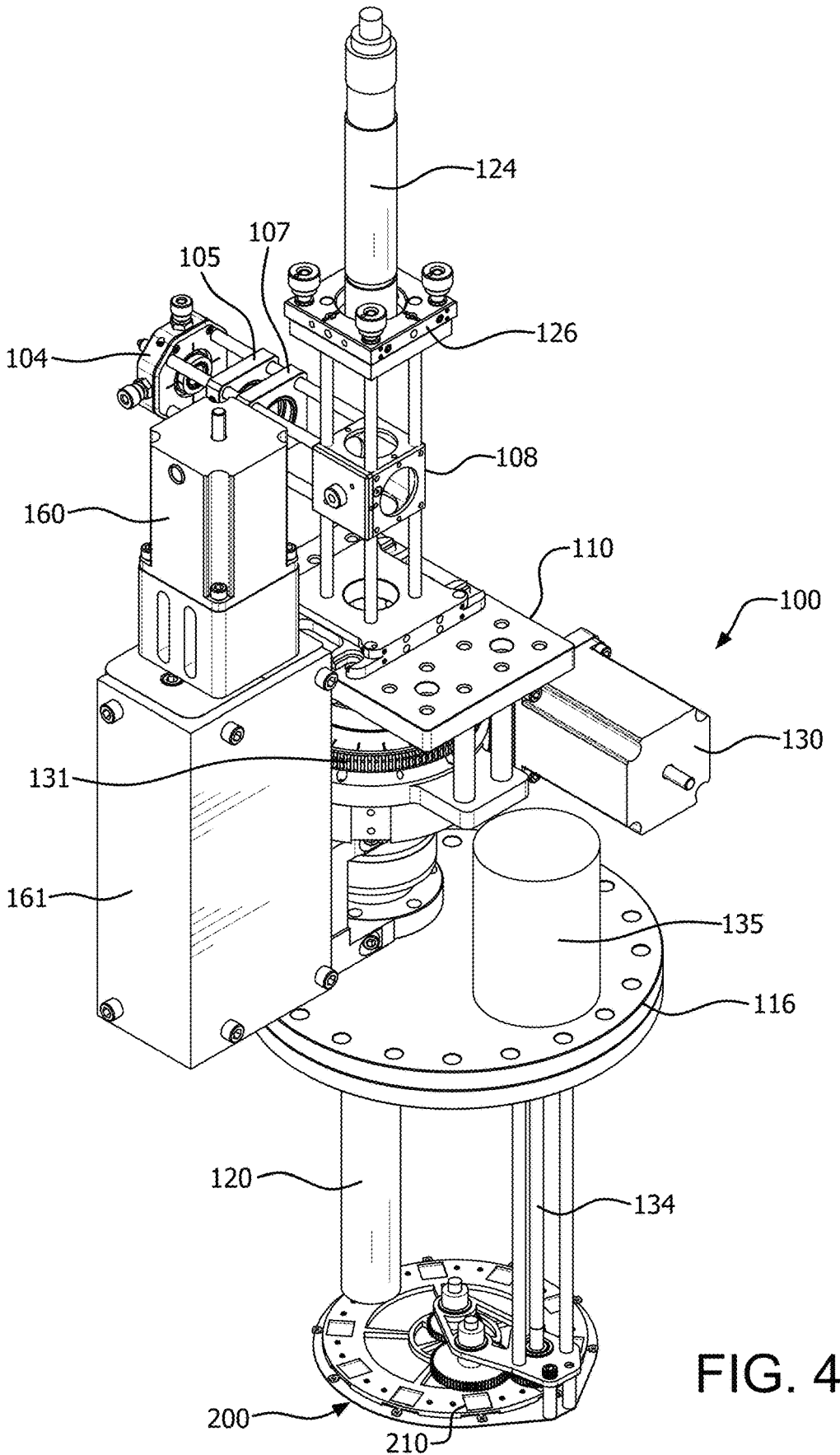
FIG. 4 is a rear perspective view of the remote laser-based sample heater with sample exchange turret assembly.
Figure 5:
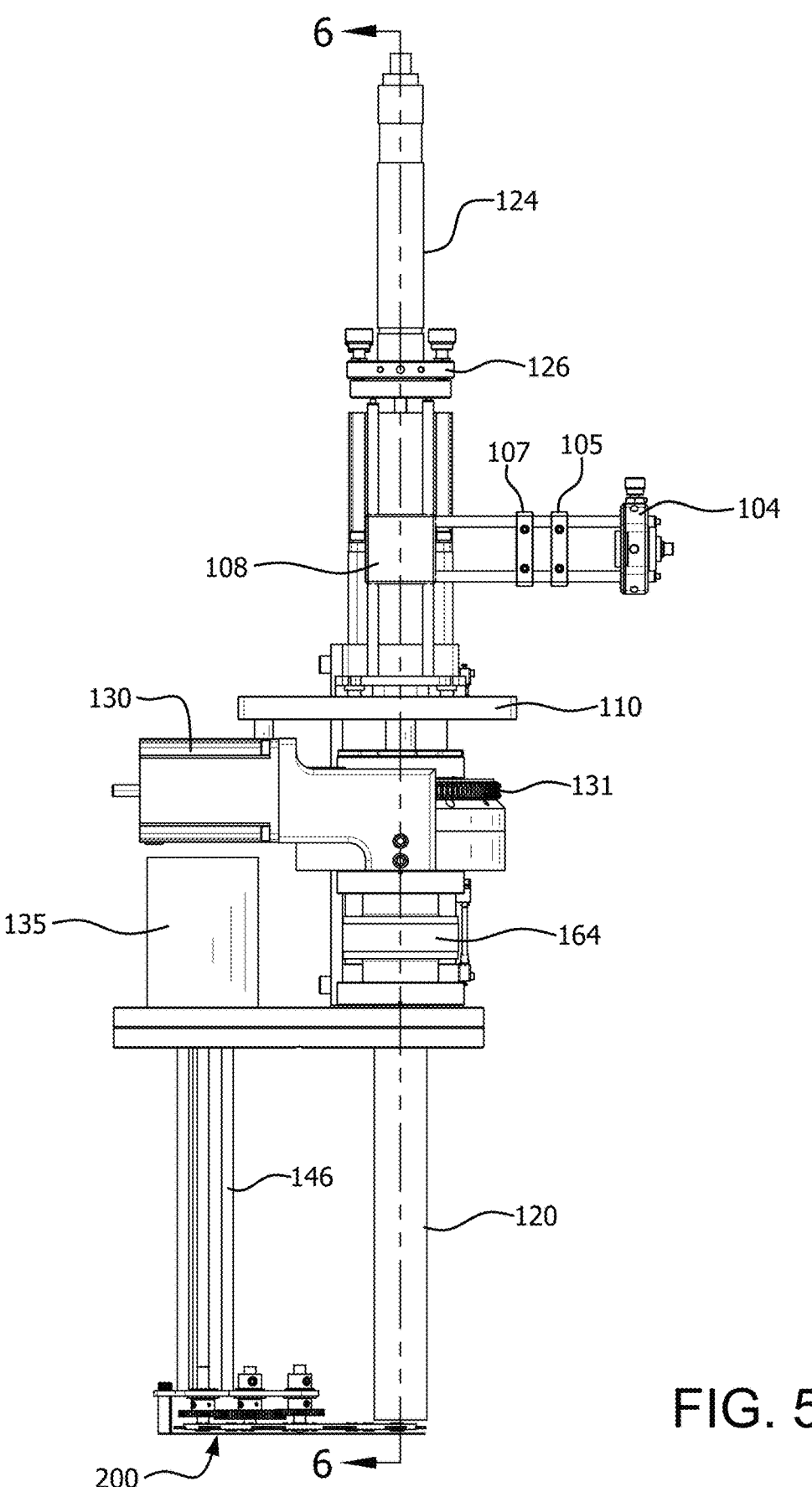
FIG. 5 is a front side elevation of the remote laser-based sample heater with sample exchange turret assembly.
Figure 6A:
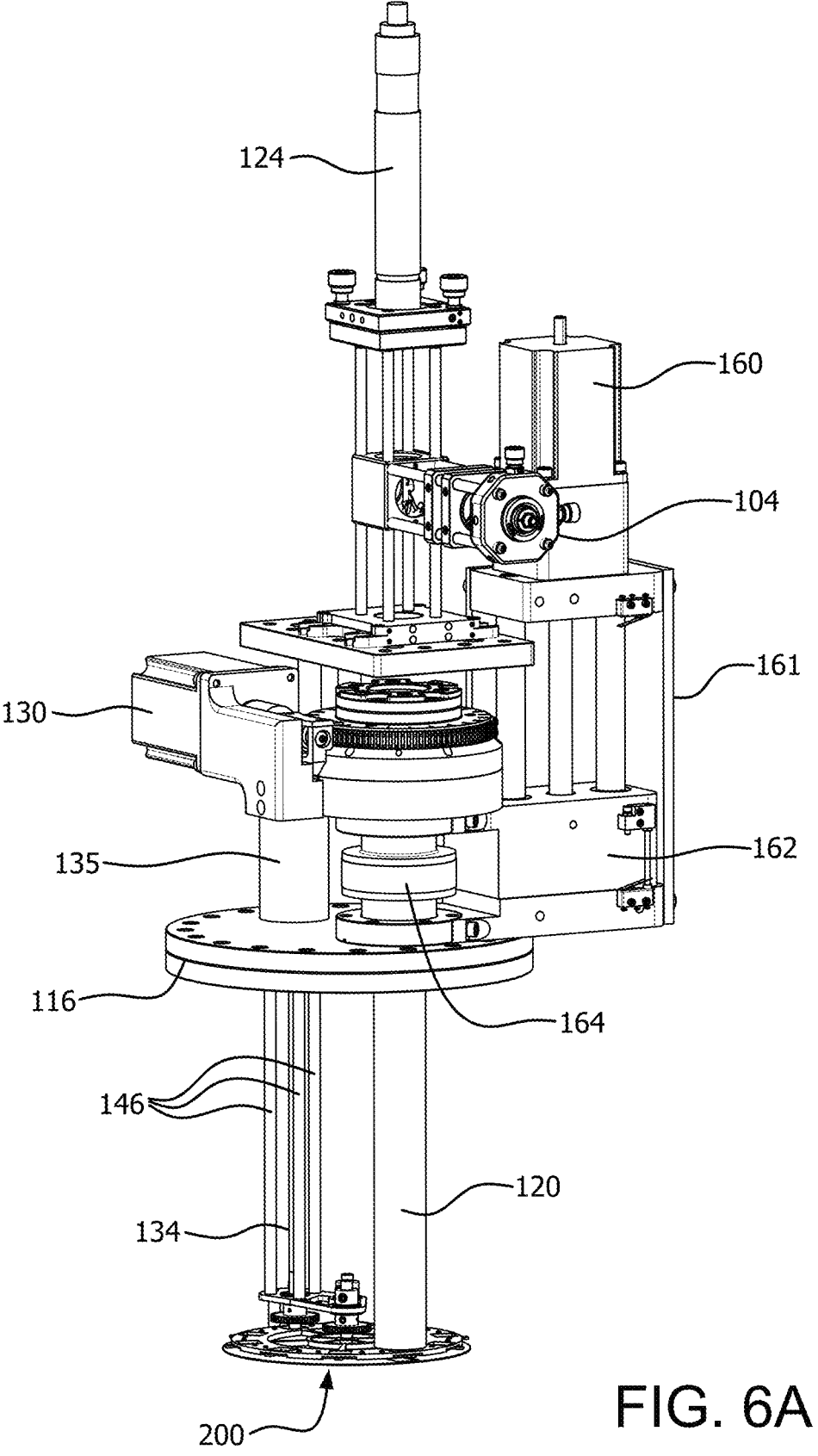
FIG. 6A is a side perspective view of the remote laser-based sample heater with sample exchange turret assembly in a first mode of operation.
Figure 6B:
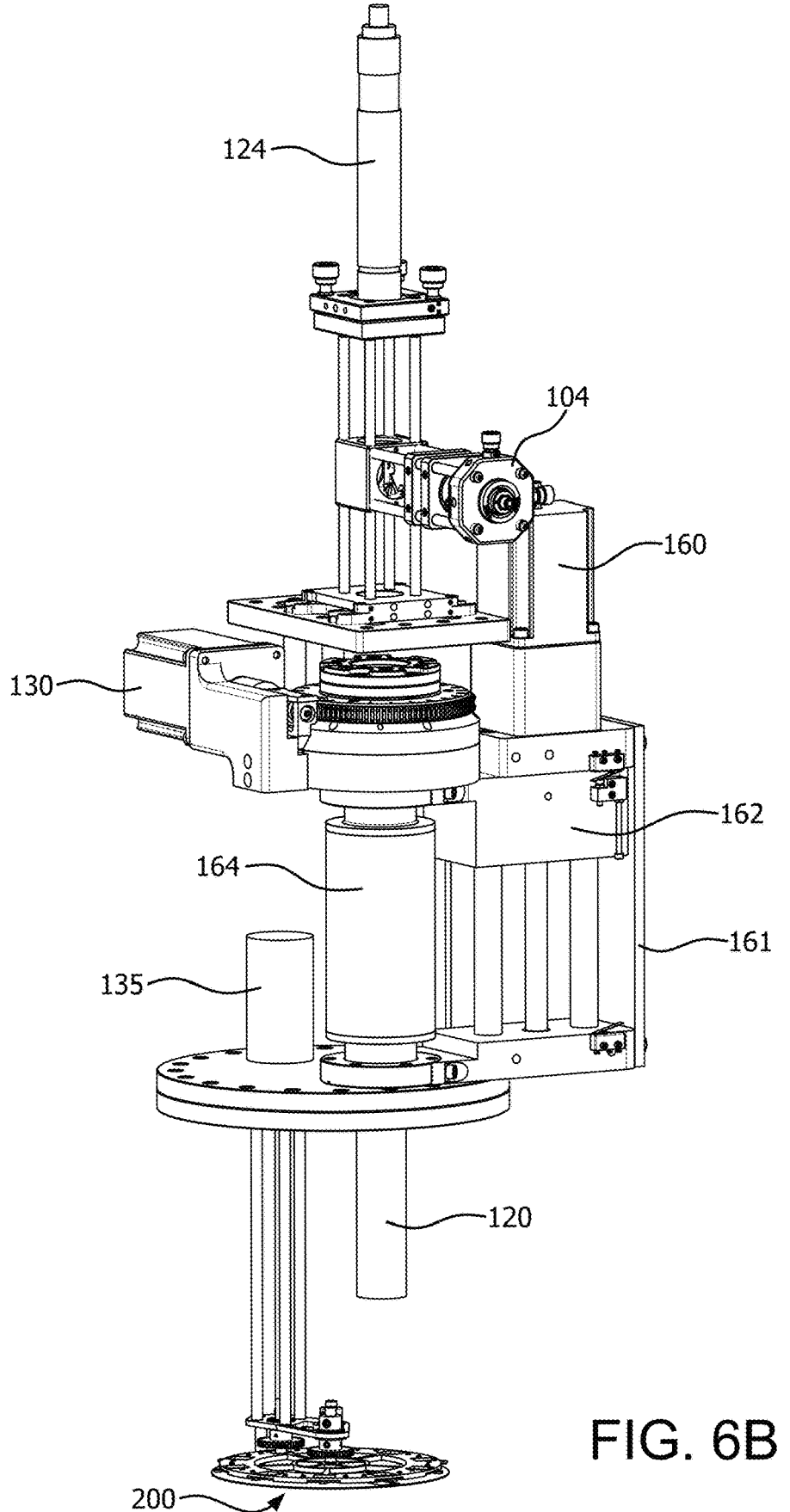
FIG. 6B is a side perspective view of the remote laser-based sample heater with sample exchange turret assembly in a second mode of operation.
Figure 7:
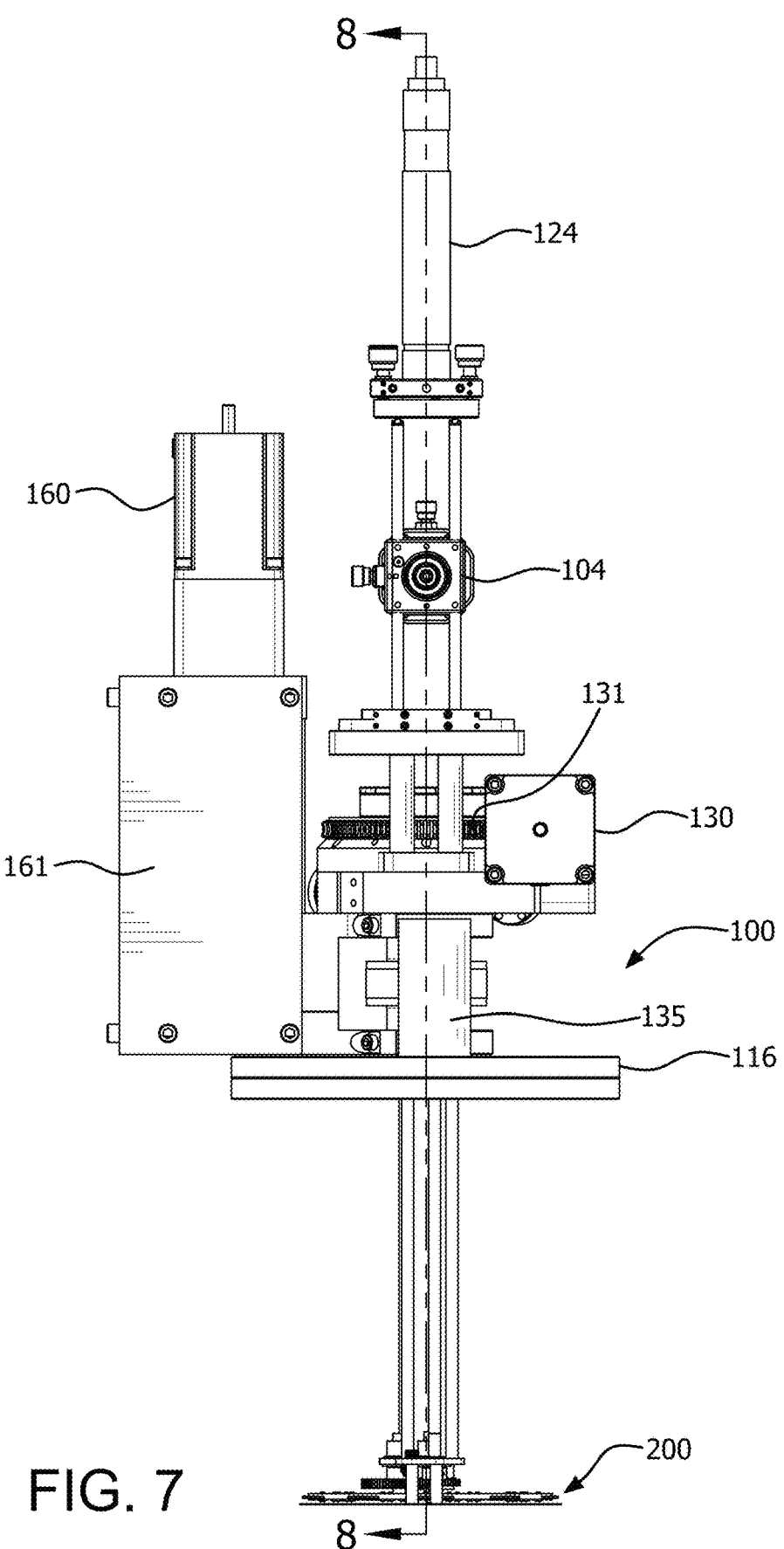
FIG. 7 is a rear side elevation of the remote laser-based sample heater with sample exchange turret assembly.
Figure 8:
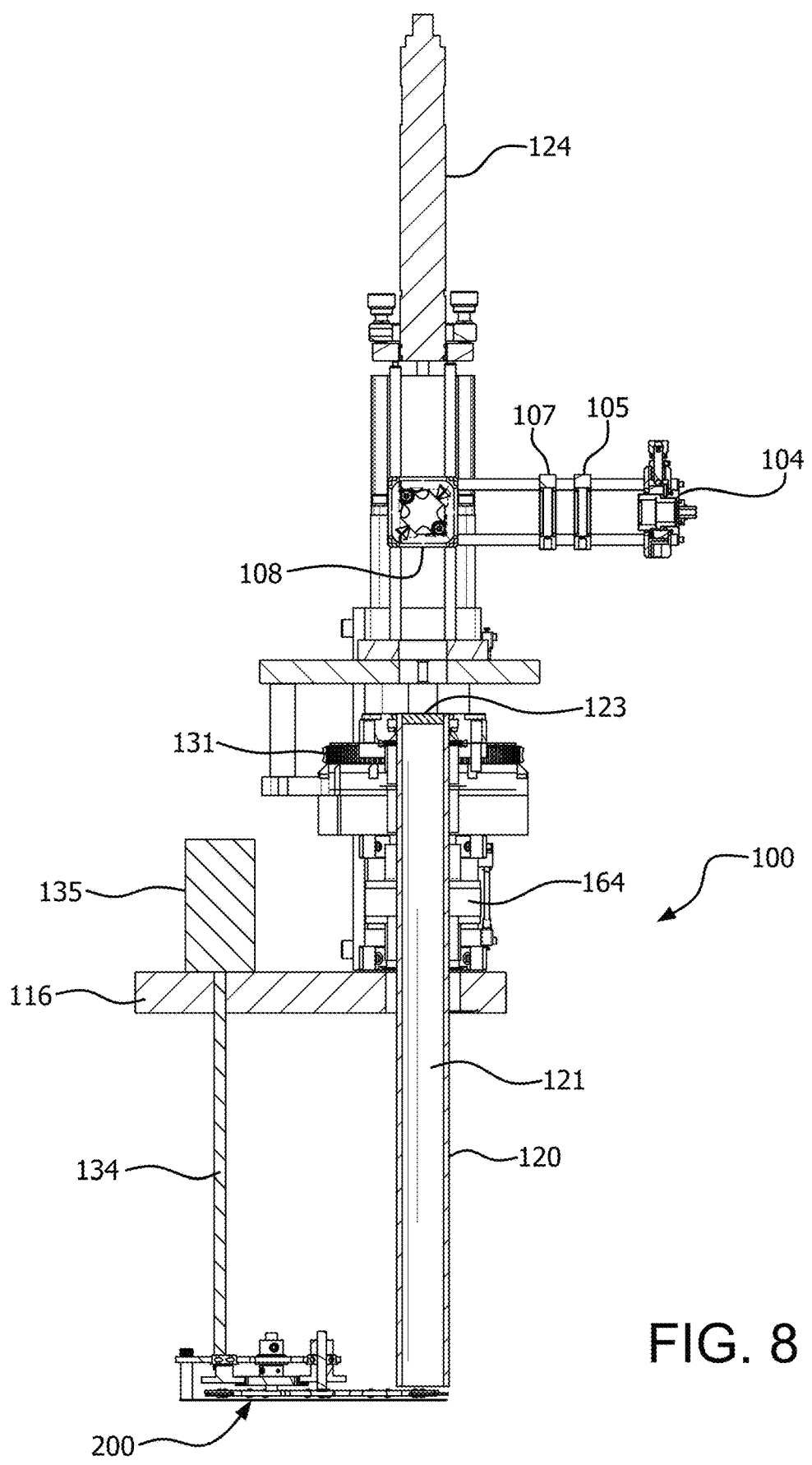
FIG. 8 is a cross-section taken along line 8-8 in FIG. 7.
Figure 9:
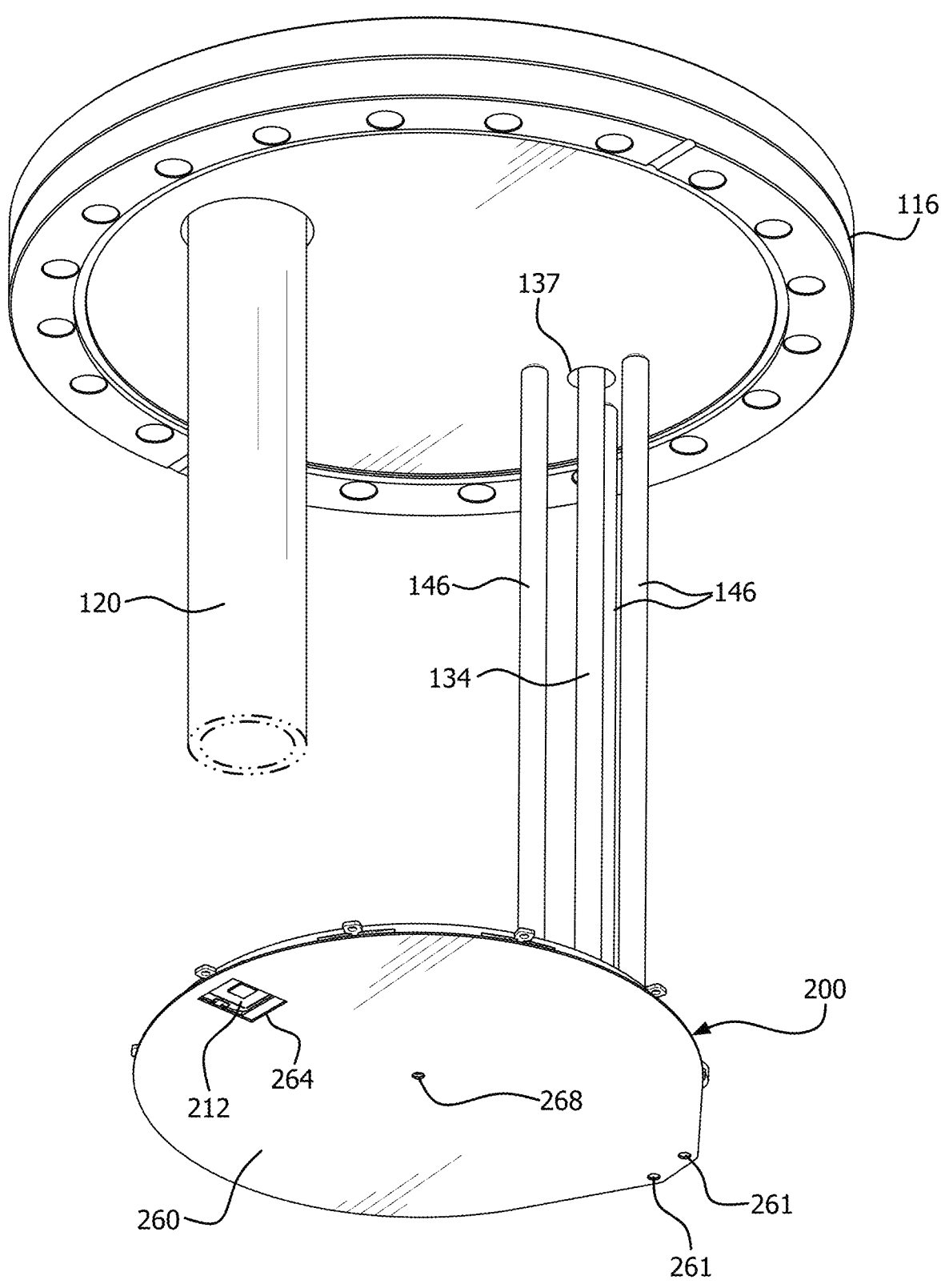
FIG. 9 is a perspective view, partially broken away, of a substrate platform.
Figure 10:
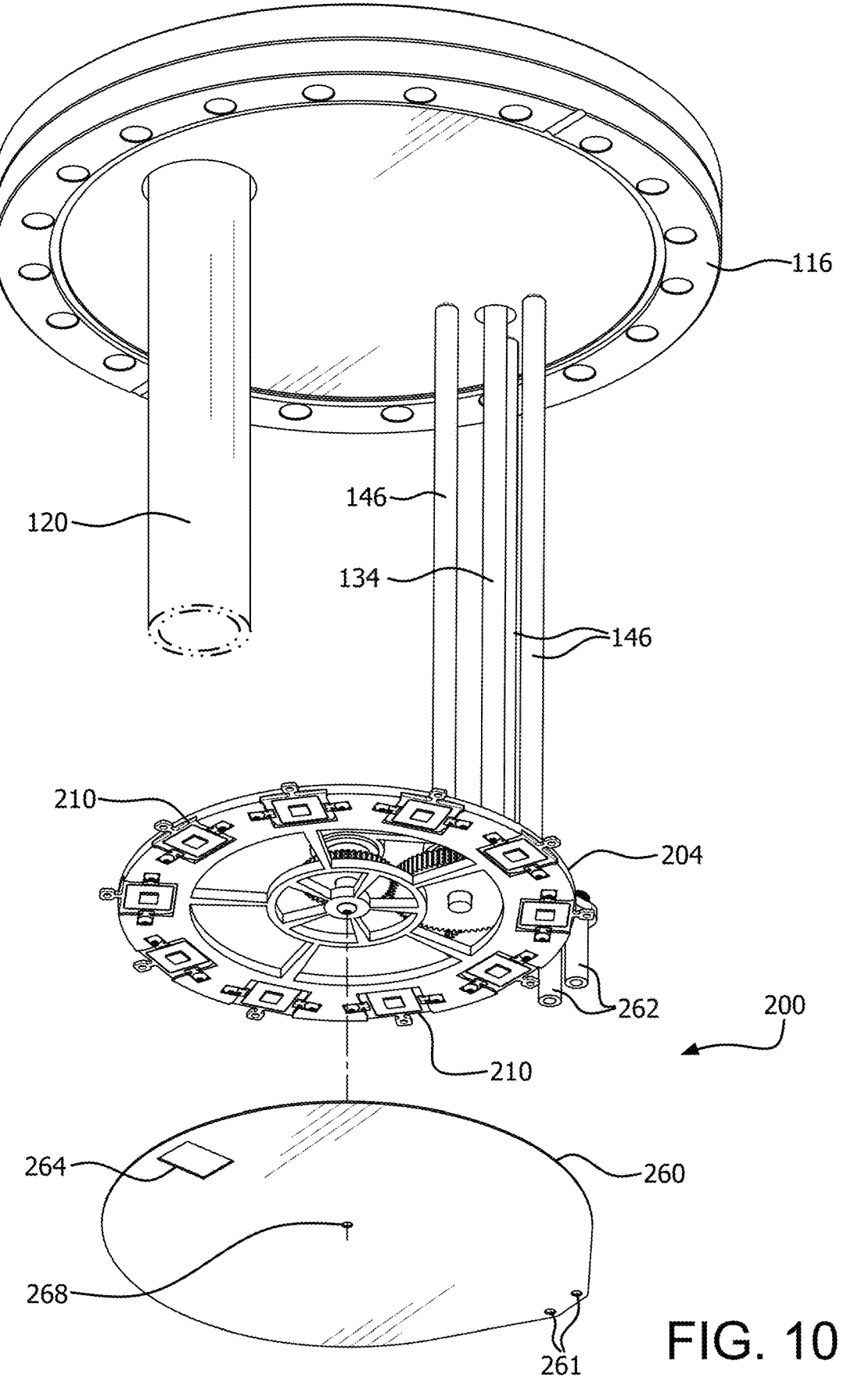
FIG. 10 is an exploded perspective view, partially broken away, of the substrate platform.
Figure 11:
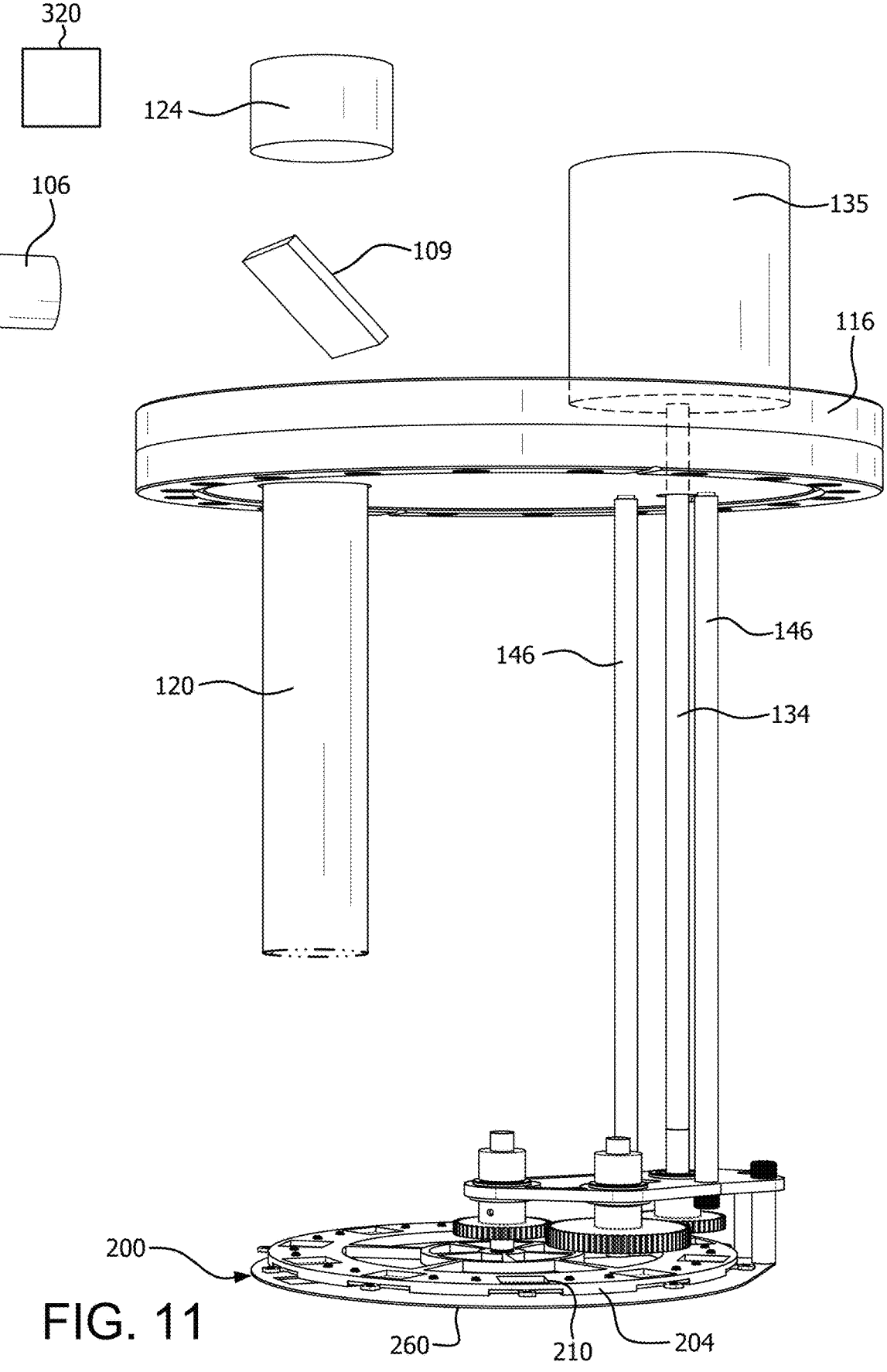
FIG. 11 is a schematic perspective view, partially broken away, of the substrate platform with ex vacuo components.
Figure 12:
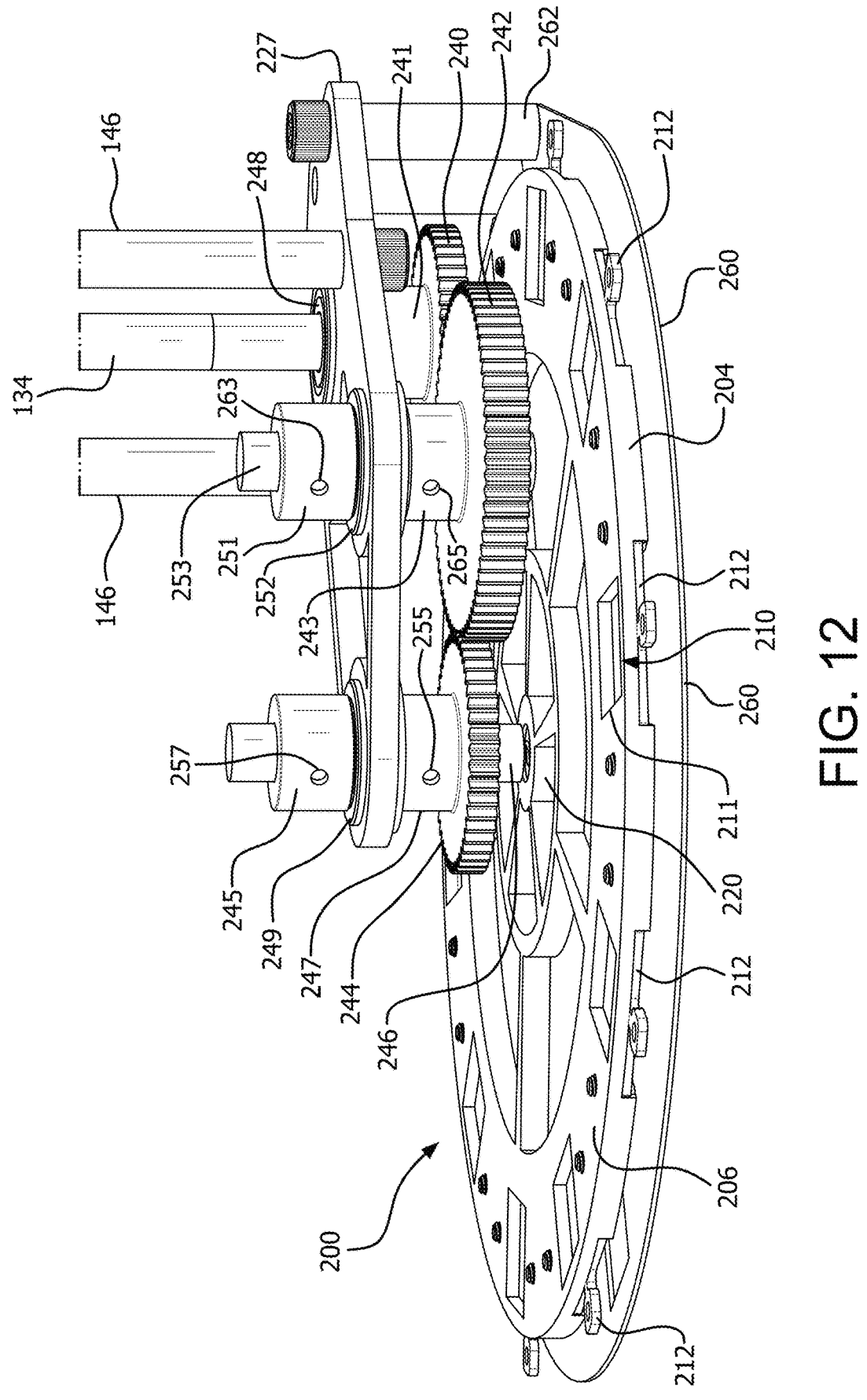
FIG. 12 is a magnified perspective of a drive gear assembly for the substrate platform.
Figure 13:
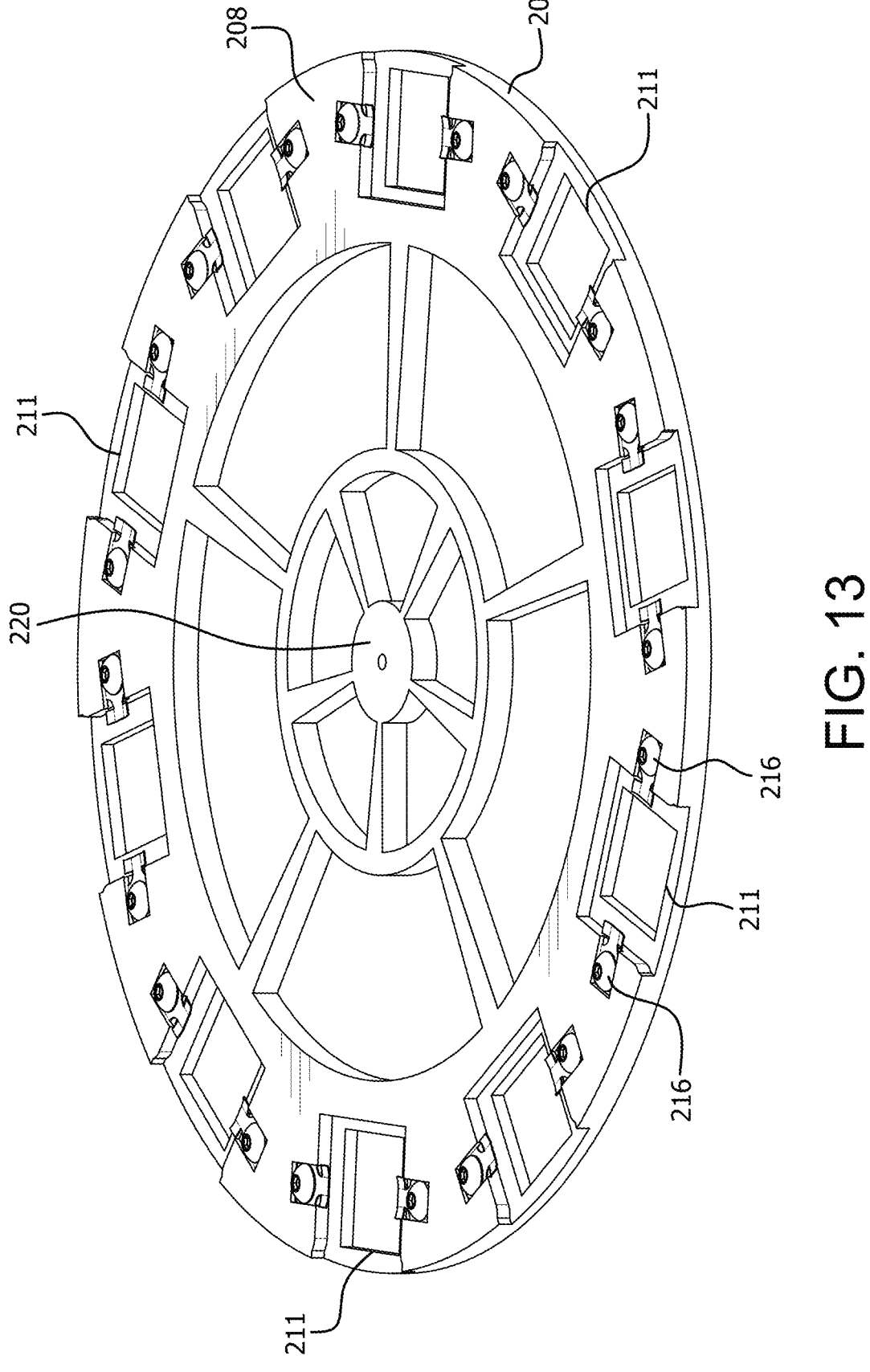
FIG. 13 is a bottom perspective view of the substrate platform, in a first mode of assembly.
Figure 14:
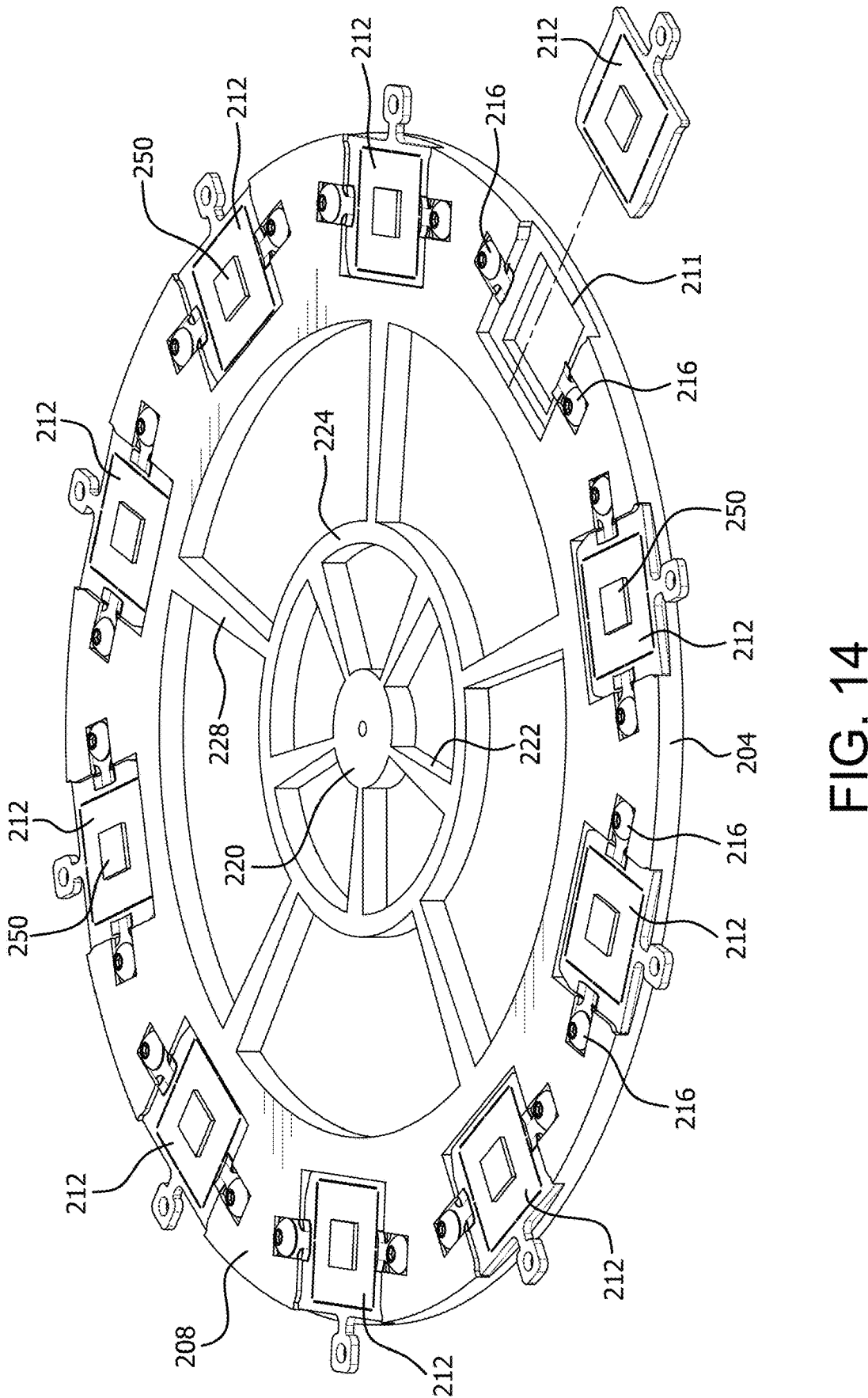
FIG. 14 is a bottom perspective view of the substrate platform in a second mode of assembly.
Figure 15:
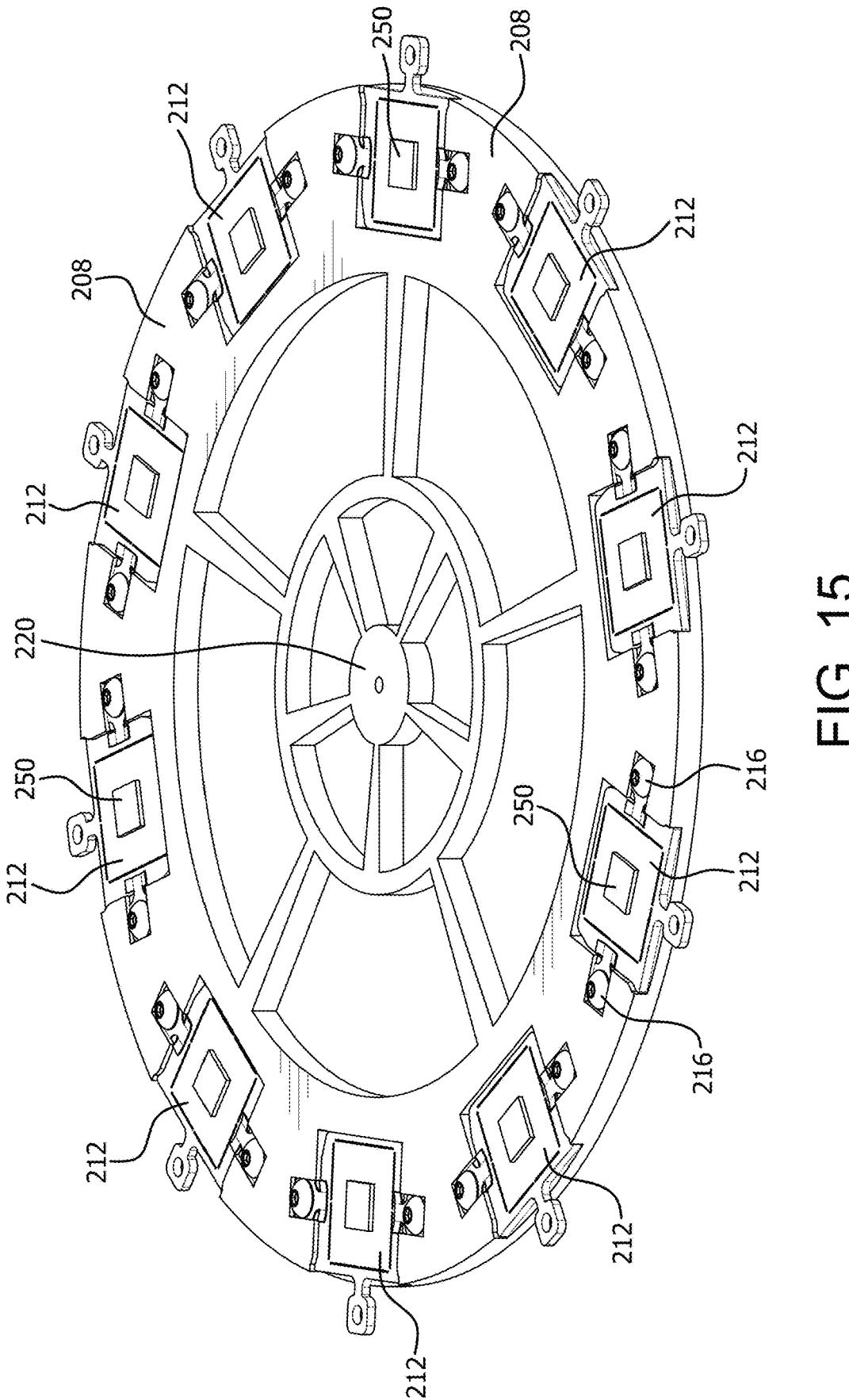
FIG. 15 is a bottom perspective view of the substrate platform in a third mode of assembly.
Figure 16:
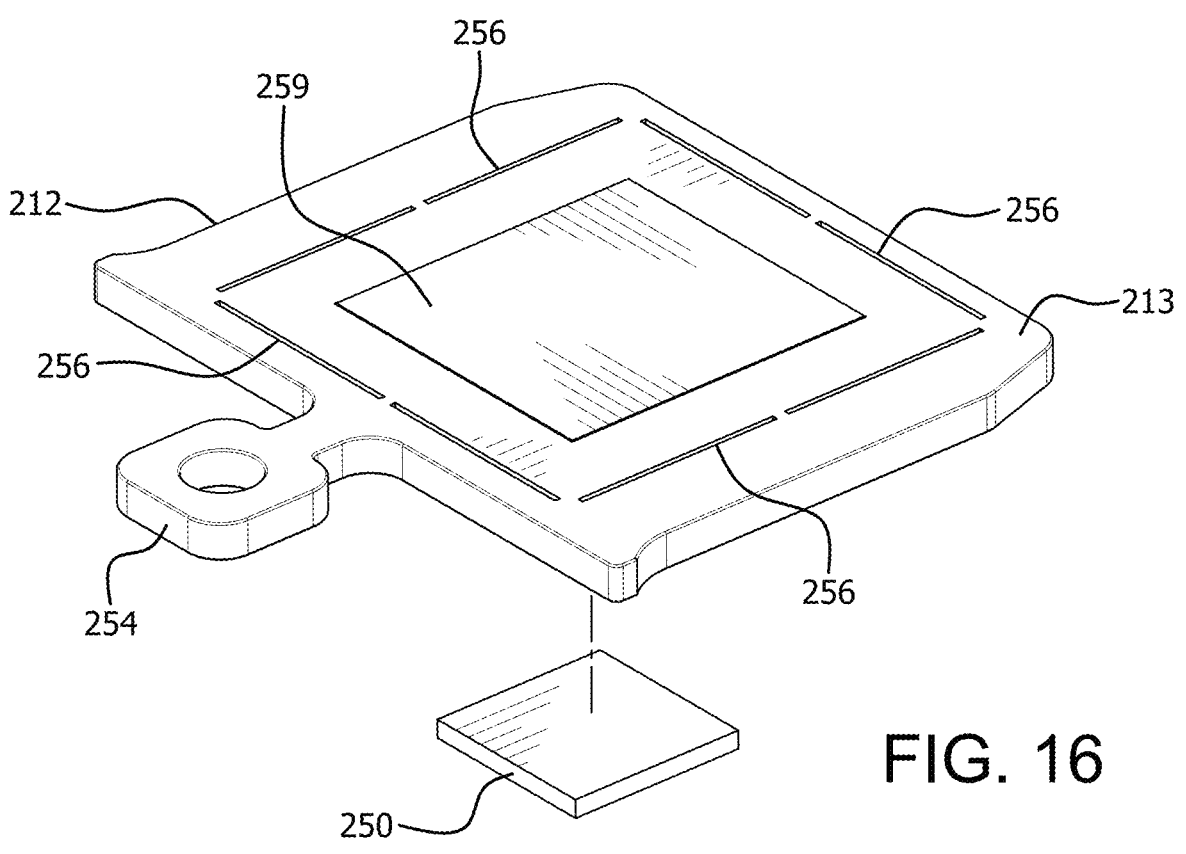
FIG. 16 is an exploded top perspective view of a substrate securing plate.
Figure 17:
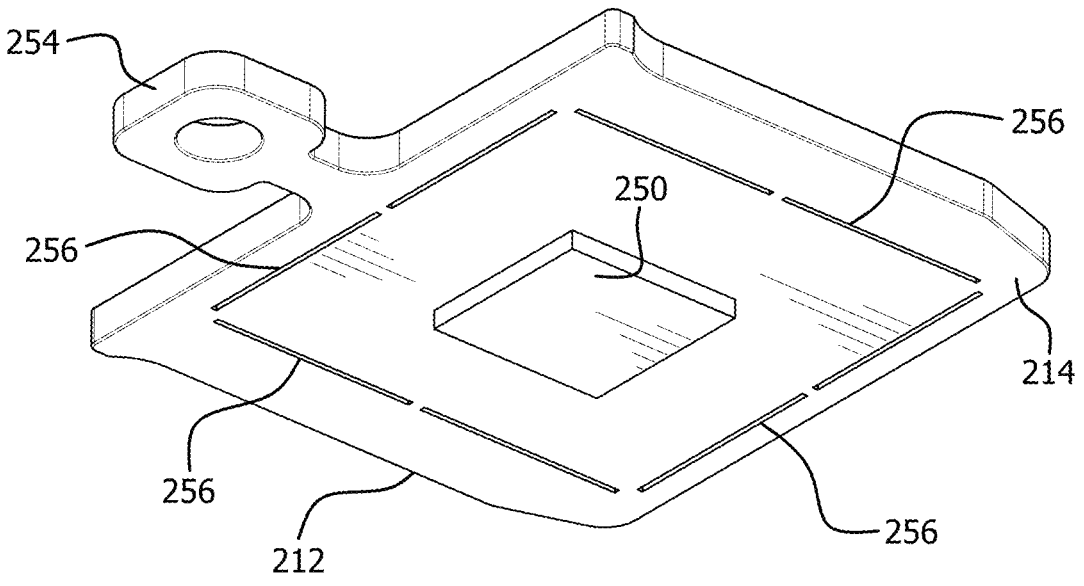
FIG. 17 is a bottom perspective view of a substrate securing plate.

A physical vapor deposition system includes a hermetic chamber with an open interior and an access port. A heating laser source is adapted to direct a heating laser beam into the open interior. A substrate holder or turret assembly comprises a substrate platform positioned in the open interior and has a plurality of substrate securing stations for securing sample substrates, and a motor for moving the platform such that each of the substrate securing stations can be positioned to intercept the heating laser beam. A target assembly retains a target within the open interior. A control system can include a processor for controlling the operation of the heating laser beam and the motor.

The substrate holder can have differing shapes and dimensions. The substrate holder can be planar and the substrate securing stations can be substantially coplanar. The substrate holder can be configured as a wheel. The wheel can rotate about an axis that is parallel to the heating laser beam. The wheel has a diameter, and the access port has a diameter, and the diameter of the wheel is less than the diameter of the access port so that the wheel can be placed into and removed from the hermetic chamber through the access port. The access port can have any size. A common size for commercial physical vapor deposition systems is approximately 6 inches. The motor drives a transmission system to rotate the wheel.

A shielding member can be provided for shielding queued substrate securing stations from the physical vapor deposition vapors and allow only the substrate being heated by the heating laser beam to be contacted by the physical vapor deposition vapors. A substrate opening in the shielding member exposes the substrate of a particular one of the substrate securing stations positioned at the opening to the physical vapor deposition vapors.

A sealing support member can be provided for sealing the access port and supporting the substrate platform within the hermetic chamber. The sealing support member can include a laser transmissive portion aligned with the laser beam and the opening of the shielding member for permitting the laser beam to strike a substrate securing station aligned with the heating laser transmissive portion and the opening of the shielding member. The heating laser beam source can be external to the hermetic chamber and the sealing support member can include a reflecting member for redirecting the heating laser beam through the laser transmissive window and to a substrate securing station.

The heating laser beam can have differing characteristics. Common wavelengths are 780 nm to 2200 nm, and 10600 nm, with durations ranging from continuous wave to pulsed operation at 10 s to 100 s of kHz, and powers ranging from ~100 watts for these cm-scale samples to 100 s of watts for larger scale samples.

The physical vapor deposition system can include an energy source for vaporizing the target. Any suitable energy source can be used. The energy source can be at least one selected from the group consisting of a pulsed or continuous wave laser; resistive heating element in boat, filament, or crucible form; cathodic arc; pulsed or continuous electron beam; RF, DC, pulsed, or ion beam sputtering; and RF or DC plasma discharge. Other target energy sources are possible.

The substrate securing stations can take many forms. The substrate securing stations in one embodiment comprise removable substrate securing plates capable of securing a substrate and being detachably connectable to the substrate platform. The substrate securing plates can have thermal break openings. The substrate securing plates can include a susceptor region. The susceptor when struck by the heating laser beam enhances translation of the energy from the heating laser beam to the substrate securing plate being heated to heat the secured substrate. Other substrate securing station designs are possible.

Control of the process can be performed by sensors and processors. The physical vapor deposition system can include a pyrometer for sensing the temperature of the substrate securing plates. Processors can be provided for controlling the position of the substrate platform and operation of the heating laser beam. The processor in some configurations can receive sensory data from sensors such as the pyrometer.

A method of performing physical vapor deposition includes the step of providing a hermetic chamber with an open interior and an access port and providing a heating laser source adapted to direct a heating laser beam into the open interior. A substrate holder assembly is provided and includes a substrate platform having a plurality of substrate securing stations, and a motor for moving the platform such that each of the substrate securing stations can be positioned to intercept the heating laser beam. The substrate holder assembly is positioned within the open interior of the hermetic chamber. The motor moves the platform such that each of the substrate securing stations can be positioned to intercept the heating laser beam. A heating laser beam tube can be provided to shield the heating laser beam as it travels toward the substrate. The heating laser beam tube can have a laser transmissive window which seals the laser beam tube to maintain the vacuum in the hermetic chamber.

A target is provided on a target assembly within the open interior. A substrate securing station is positioned so as to be intercepted by the heating laser beam. The pressure in the hermetic chamber will be reduced to a vacuum by a suitable pump. An energy source energizes a target held by the target assembly, whereby target material will be vaporized, while directing the heating laser beam at the substrate securing station so as to heat the substrate that is undergoing physical vapor deposition.

A control system comprising a processor is used to cease operation of the heating laser beam, operate the motor to move the substrate platform to move another substrate securing station into the path of the heating laser beam, and then turn on the heating laser beam to generate a heated substrate. The method can further include the step of providing a pyrometer and using the pyrometer to control the heating laser beam and thereby the temperature of the heated substrate. The method could possibly include the step of using the control system to control operation of an energy source for the target.

The substrate securing stations can be removable substrate securing plates. The method can include the step of securing a substrate to a substrate securing plate and securing the substrate securing plate to the substrate platform prior to physical vapor deposition. The method can further include the step of removing the substrate securing plate and the substrate after physical vapor deposition has been performed on the substrate.

The substrate holder can be planar and the substrate securing stations can be coplanar. The substrate holder can be configured as a wheel, and the wheel can be rotated about an axis that is parallel to the heating laser beam. The wheel has a diameter, and the access port has a diameter, and the diameter of the wheel can be less than the diameter of the access port. The method further comprising the steps of passing the wheel through the access port before and then after all physical vapor deposition steps are completed.

The method can further include the step of providing a shielding member and using the shielding member to shield queued substrate securing stations from the vaporized target material. The shielding member comprises a vapor transmissive portion. The vapor transmissive portion can be aligned with the heating laser beam. The method includes positioning a substrate securing station and substrate adjacent to the laser transmissive portion such that the substrate securing station and substrate will be heated by the laser during the physical vapor deposition.

A substrate holder assembly is provided for a physical vapor deposition system having a hermetic chamber with an access port. The substrate holder assembly includes a substrate platform positioned in the open interior and having a plurality of substrate securing stations, and a motor for moving the platform such that each of the substrate securing stations can be positioned to intercept the heating laser beam. The substrate holder assembly further includes a support. The support is connectable to the access port so as to hermetically seal the access port and is connected to the substrate platform to support the substrate platform in the open interior.

The substrate securing stations can include removable substrate securing plates capable of securing a substrate and being detachably connectable to the substrate platform. The substrate securing plates can include a susceptor region. The susceptor region when struck by the laser beam enhances translation of the energy from the laser beam to the substrate securing plates to heat the secured substrate. The substrate securing plates can include one or more thermal break openings.

There is shown in FIGS. 1-17 a physical vapor deposition system 10 according to the invention. The physical vapor deposition system 10 includes a hermetic chamber 14 with an open interior 16 and one or more hermetically closeable access ports 17 that can be closed by removable caps 18 or other suitable structure. A target 30 comprising the material to be vaporized can be provided on a suitable support 34. Various targets and supports are possible.

A laser and substrate assembly 100 supports and moves a plurality of substrates within the open interior 16 and aligns a heating laser beam with a particular one of the substrates positioned on a substrate holder assembly 200. The laser and substrate assembly 100 can include a heating laser connection 104 for connecting to a fiber optic heating laser source 106 (shown schematically in FIG. 11) and directing the heating laser beam towards a dichroic mirror housing 108 which can contain a dichroic mirror 109 for redirecting the heating laser beam and allow passage of infrared sensory signals. Laser focusing lenses 105 and 107 can also be provided. The dichroic mirror housing 108 is supported by a suitable base 110 which can include a heating laser opening 112 for permitting the passage of the heating laser beam as well as infrared sensory signals for devices such as a pyrometer. The base 110 can be secured to a suitable mounting plate 114.

The mounting plate 114 can be secured to a sealing support member 116. The function of the sealing support member 116 is to connect to and seal an access port 17. The access port that the sealing support member connects to can be an existing access port 17 as is commonly found on hermetic chambers 14 used for physical vapor deposition, or a custom access port specifically created for the laser and substrate assembly 100. The substrate holder assembly 200 can thereby be secured in place to any appropriately sized access port which can provide significant variability in mounting options, as hermetic chambers for physical vapor deposition can have several different access ports 17 positioned about the hermetic chamber 14.

A heating laser beam tube 120 is connected to the sealing support member 116 and extends into the open interior 16. The heating laser beam tube 120 has an open interior 121 which allows transmission of the heating laser beam therethrough and protects the heating laser beam from contact with particulates and vapors within the open interior 16 of the hermetic chamber 14 during the physical vapor deposition process. A laser transmissive window 123 seals the tube to maintain the vacuum in the hermetic chamber 14. A motor 130 can be provided to rotate a suitable gear 131 and thereby the laser beam tube 120. A motor 135 can be provided to rotate a drive shaft 134 for the substrate holder assembly 200. Supporting rods 146 can be connected between the sealing support member 116 and the substrate holder assembly 200 to support the substrate holder assembly 200 in position within the open interior 16 of the hermetic chamber 14.

Sensory devices such as pyrometer 124 for directly or indirectly sensing the temperature of the substrate undergoing physical vapor deposition can be provided. The pyrometer 124 can be mounted on a pyrometer support 126 that is supported above the dichroic mirror housing 108. A pyrometer opening 128 can be provided in the dichroic mirror housing 108 and can be aligned with the heating laser opening 112 such that infrared can pass to the pyrometer 124 from the substrate stations within the hermetic chamber 14.

A motor 160 can be provided to raise or lower the laser beam tube 120. The motor 160 connects to a suitable actuator assembly box 161 housing an actuator 162. Operation of the motor 160 raises or lowers the actuator 162 which is connected to the heating laser beam tube 120. A hermetic bellows 164 can be provided to expand and contract with the raising and lowering of the heating laser beam tube 120.

The substrate holder assembly 200 is particularly shown with reference to FIGS. 9-17. The substrate holder assembly 200 is supported below the sealing support member 116 by connecting rods 146. A substrate platform 204 has a top surface 206, a bottom surface 208, and a plurality of substrate securing stations 210 for retaining substrate samples which will be treated by physical vapor deposition.

The substrate securing stations 210 can secure the substrate by any suitable method or structure. In the embodiment shown, the substrate securing stations comprise removable substrate securing plates 212 onto which substrate samples 250 are secured on a bottom side. The substrate securing plates 212 have a top surface 213 and a bottom surface 214. A substrate 250 can be secured to the bottom surface 214 by any suitable means such as fasteners and adhesives. The substrate securing plates 212 can be detachably secured to the substrate platform by suitable structure such as retaining fingers 216.

Attachment protrusions 254 can be provided to facilitate the placement and removal of the substrate securing plates 212. The substrate securing stations 210 can comprise a plurality of laser passage openings 211 in the substrate platform 204 through which a heating laser beam can strike and heat the substrate securing plates 212 and by heat convection through the substrate securing plates 212 heat the substrate attached sample 250. The substrate securing plates 212 will become quite hot and can have heat transfer interrupting slits 256 to retain the heat in the vicinity of the substrate 250. A susceptor region 259 can be provided to facilitate the generation of heat by the heating laser beam. The susceptor region 259 is made either from a material coating or surface restructuring which strongly absorbs the energy of the heating laser beam to generate heat which will transfer to the substrate securing plate and to the substrate 250.

The substrate platform can have any suitable shape, including linear shapes and geometric shapes so long as a plurality of the substrate securing stations are provided and are capable of being moved into position in order to intercept the heating laser beam. In the embodiment shown, the substrate platform is a wheel having a hub 220, inside spokes 222, a support ring 224, and outer spokes 228 (FIG.

14). This construction will reduce the weight of the substrate platform 204 while maintaining rigidity. Other constructions are possible.

The manner in which the substrate platform 204 is moved can vary. As shown particularly in FIG. 12, the drive shaft 134 extends from the motor 135 through a suitable opening 137 in the sealing support member 116. The drive shaft 134 extends through a support plate 227 and connects to a drive gear 240. The drive gear 240 has a hub 241 that connects to the drive shaft 134 by suitable structure such as a set screw and abuts a bearing 248 that is embedded into support plate 227. The drive gear 240 connects to an intermediate gear 242 which is rotatably connected to the support plate 227. A rotatable shaft 253 extends through an embedded bearing 252 in the support plate 227. The intermediate gear 242 has a hub 243 which connects to the shaft 253 by suitable structure such as set screw 265. A shaft collar 251 is also secured to the rotatable shaft 253 with set screw 263. The shaft collar 251 abuts an embedded bearing 252 in the support plate 227. The intermediate gear 242 can engage a final drive gear 244. A rotatable shaft 246 extends through an embedded bearing 249 in the support plate 227. The final drive gear 244 has a hub 247 which connects to the rotatable shaft 246 by suitable structure such as a set screw 255. A shaft collar 245 is also connected to the rotatable shaft 246 and abuts an embedded bearing 249 in the support plate 227. The shaft 246 connects to the hub 220 of the substrate platform 204 by a screw 268 such that rotation of the drive shaft 134 is transferred to the substrate platform 204.

A protective cover or shield is provided for the substrates that are queued for physical vapor deposition but are not yet actively engaged in the process, so that a substrate 250 secured to a substrate securing station 210 that is not positioned to intercept the heating laser beam will not be subjected to the vapor deposition. The function is performed by a cover or shield 260 that is secured to an underside of the substrate platform 204. The shield 260 is secured in place by attachment posts 262 and screws 261 (FIGS. 9-10) or other structure to retain the shield 260 fixed in position. The shield 260 has a deposition opening 264 that is aligned with the heating laser beam, and when the substrate platform 204 is rotated by the motor 135, aligns a substrate securing station 210 with the heating laser beam such that the associated substrate securing plate 212 is exposed to the heating laser beam on one side and the deposition vapors deposit on the associated substrate 250 on the opposite side of the substrate securing plate.

Figure 18:
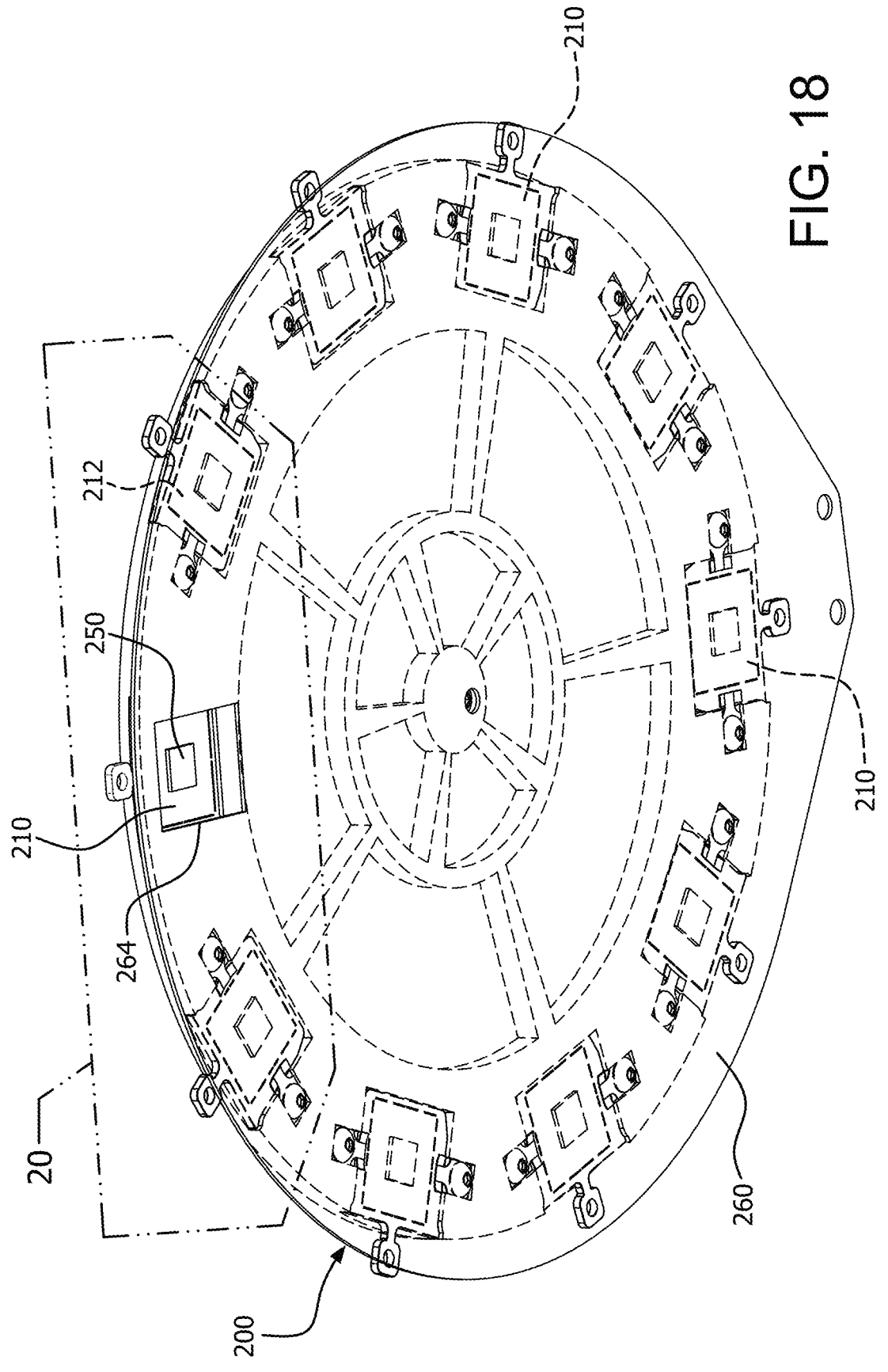
FIG. 18 is a bottom perspective view, partially in phantom of a substrate platform and shield in a first mode of operation.
Figure 19:
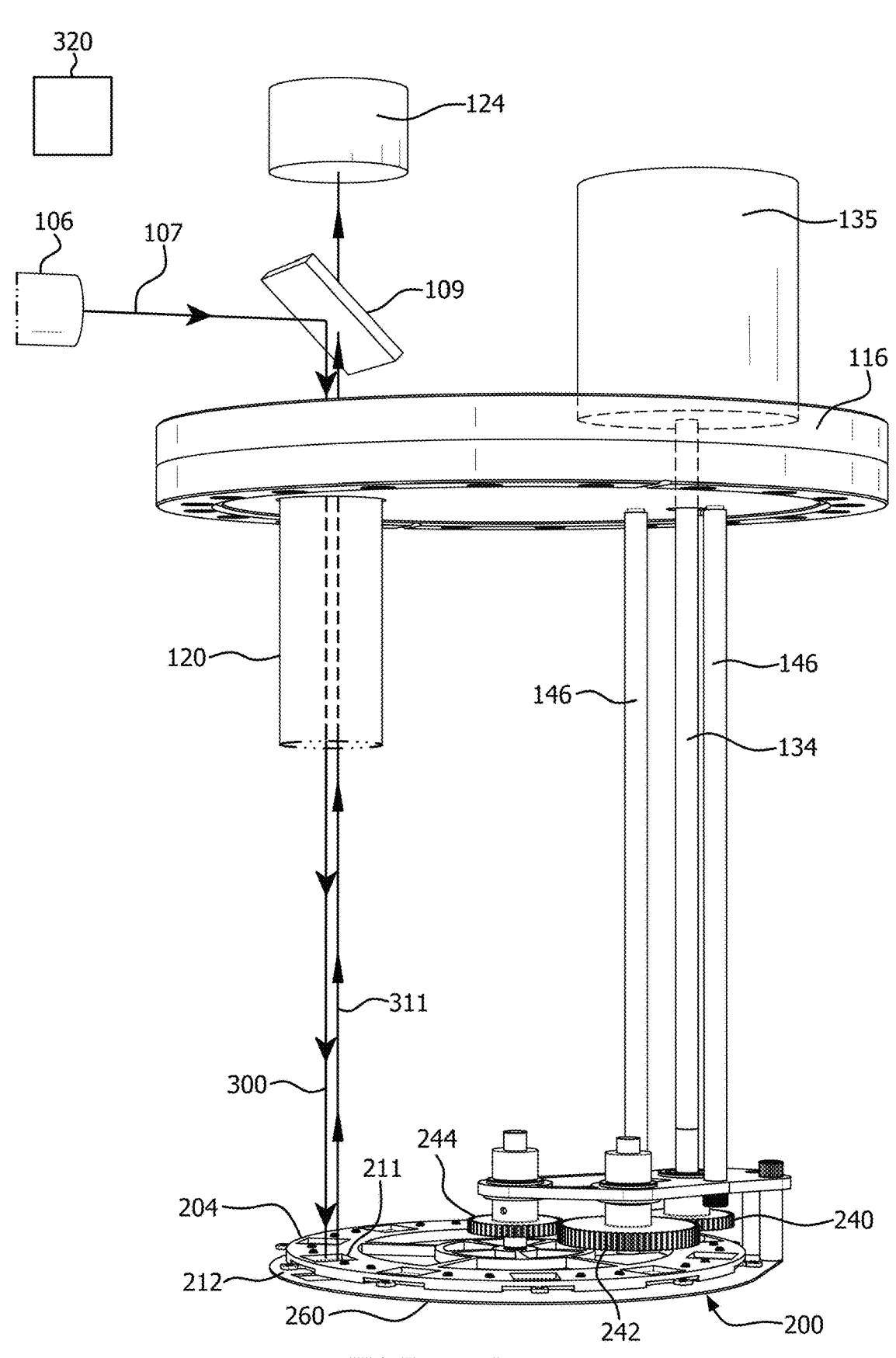
FIG. 19 is a schematic side elevation showing operation of the substrate platform with ex vacuo components.

Operation of the invention is illustrated in FIGS. 18-22. A substrate securing station 210 is aligned with the deposition opening 264 of the shield 260 so as to expose the associated substrate 250 to the physical vapor deposition process. Remaining substrate securing stations 210 shown in phantom are protected by the shield 260 from the deposition process (FIG. 18). The laser source 106 directs a source laser beam 107 through a fiber optic to the dichroic mirror 109 which reflects and redirects the source laser beam 107 to a heating laser beam 300 that is aimed at the substrate securing station 210 that passes through the heating laser beam tube 120 to the substrate securing plate 212 that is positioned to participate in the physical deposition process (FIG. 19). The heating laser beam 300 passes through the respective laser passage opening 211 of that substrate securing station 210 to strike the respective substrate securing plate 212. A signal 311 from susceptor region 259 or the pyrometer 124 can pass through the dichroic mirror 109. A processor 320 can be connected wirelessly or wired to control the operation of the motor 135 and the heating laser beam source 106.

Figure 20:
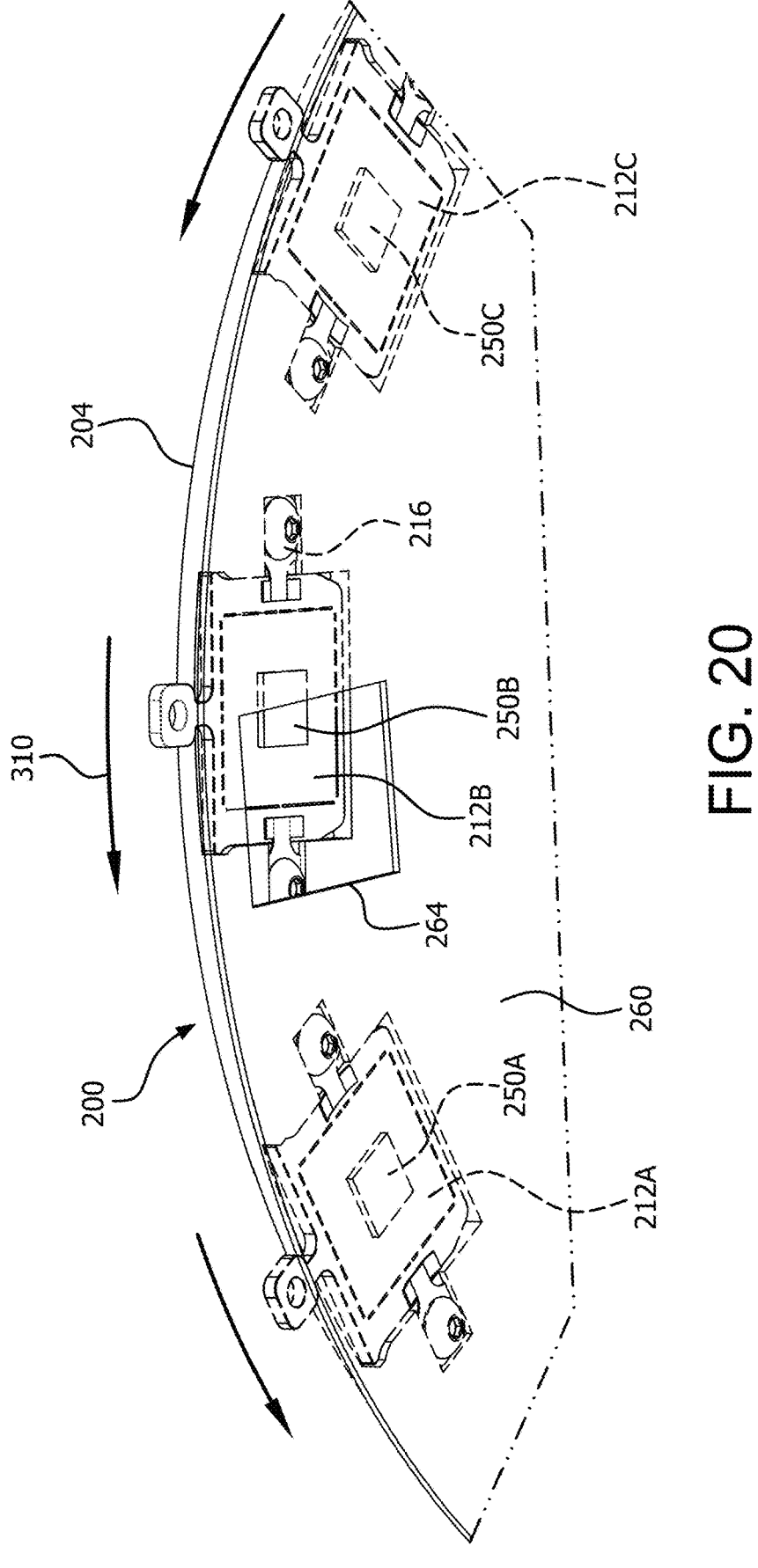
FIG. 20 is a schematic diagram, partially in phantom, showing operation of the substrate platform and shield in a first mode of operation.
Figure 21:
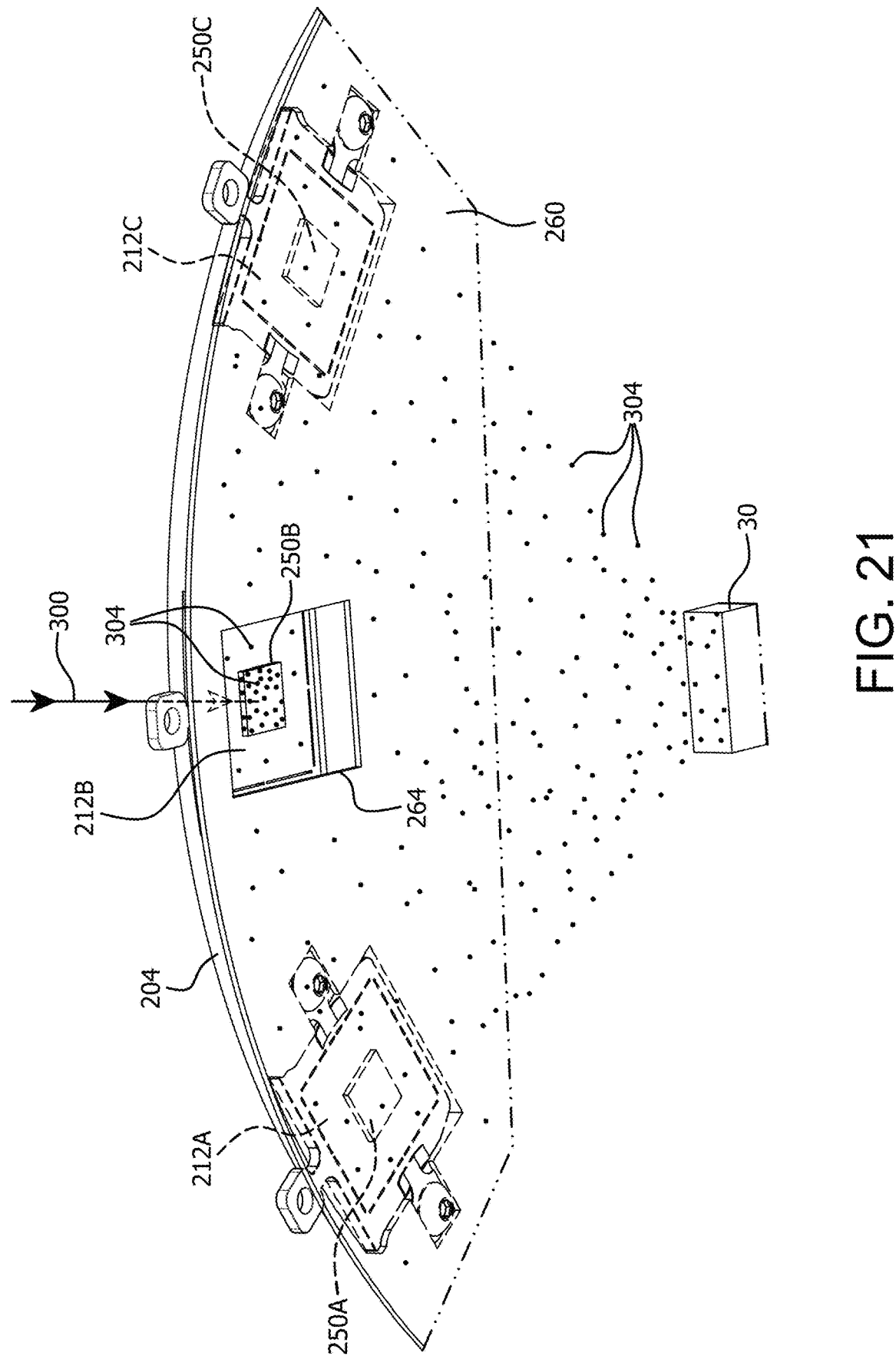
FIG. 21 is a schematic diagram, partially in phantom, showing operation of the substrate platform and shield in a second mode of operation.
Figure 22:
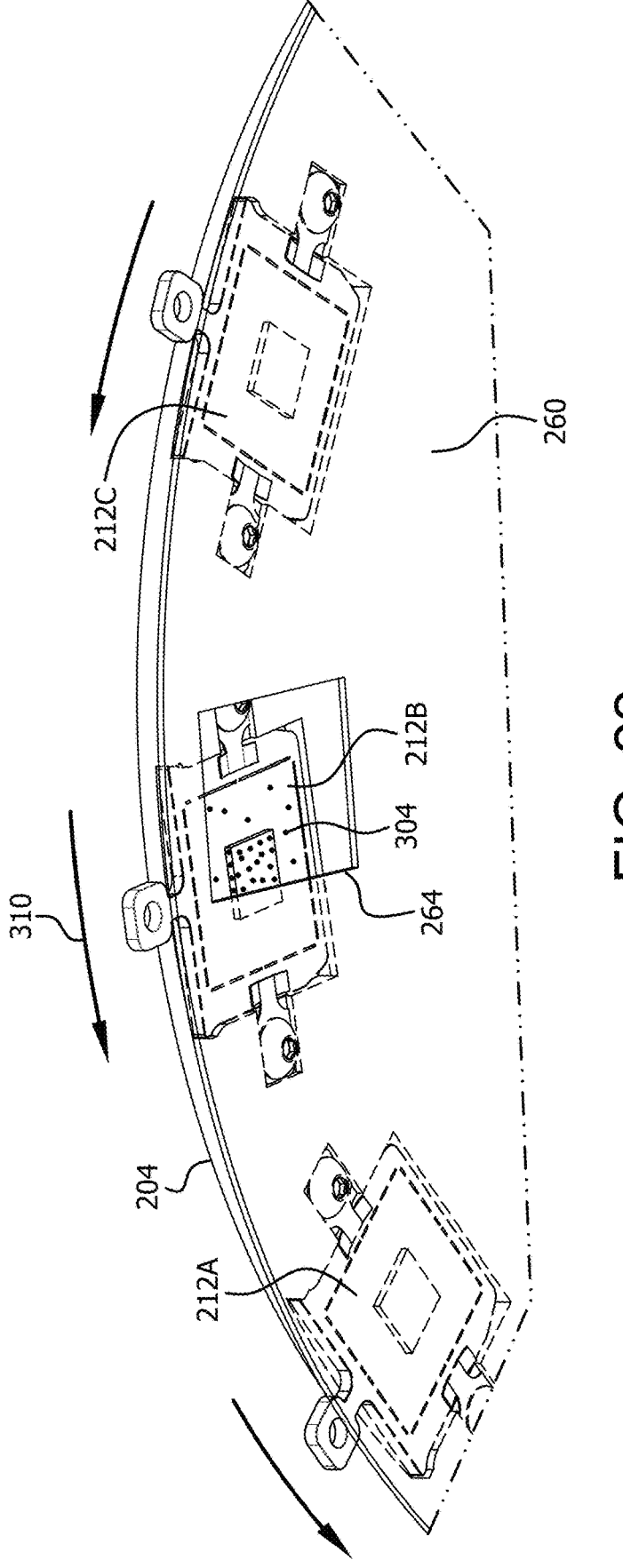
FIG. 22 is a schematic diagram, partially in phantom, showing operation of the substrate platform and shield in a third mode of operation.

The sequential operation of the substrate platform 204 is shown in FIGS. 20-22. The substrate securing plate 212A bearing a substrate 250A (shown in phantom) has been treated and the substrate platform 204 is rotated by operation of the motor 135 in the direction shown by arrows 310 to move the substrate securing plate 212A and the respective substrate 250A to a position where they are protected from the next vapor deposition process by the shield 260. The substrate platform 204 continues to rotate as shown by arrow 310 until the next queued substrate securing plate 212B with substrate 250B is moved into position over the deposition opening 264 of the shield 260 (FIG. 20). As shown in FIG. 21, the vapor deposition process begins by directing energy at the target 30 to generate vapor particles 304 which settle on the substrate 250B of the substrate securing station 212B, while the laser source 106 generates the heating laser beam 300 which strikes the substrate securing plate 212B to heat the substrate securing plate 212B and thereby the substrate 250B, while the deposition process deposits material on the substrate 250B. Substrates 250A and 250C (shown in phantom) are protected from the vapor deposition process by the shield 260. Upon completion of the physical vapor deposition process on substrate 250B, the laser source 106 is turned off and the substrate platform 204 is again rotated by the motor 135 as shown by arrows 310 to move the next queued substrate securing plate 212C and substrate 250C into position over the deposition opening 264 of the shield 260, and the process continues.

The process is facilitated by the ability of either the sealing support member 116 to be disconnected from the hermetic chamber 14, and with it the substrate holder assembly 200 and the substrate platform 204, or the shield 260 and substrate platform 204 to be disconnected from substrate holder assembly 200 and extracted through a closable access port 17. The substrate securing plates 212 can then be disconnected from the substrate platform 204 and processed further as desired. New samples can be provided on substrate securing plates 212 which are then connected to the substrate platform 204. The substrate securing platform 204 is repositioned within the open interior 16 of the hermetic chamber 14, and the sealing support member 116 is reattached to hermetically seal the chamber 14. In the latter approach, the substrate securing platform 204 and shield 260 are reattached to the substrate holder assembly 200 by passing them through a closable access port 17. The physical vapor deposition process can then continue on new substrates.

Figure 23:
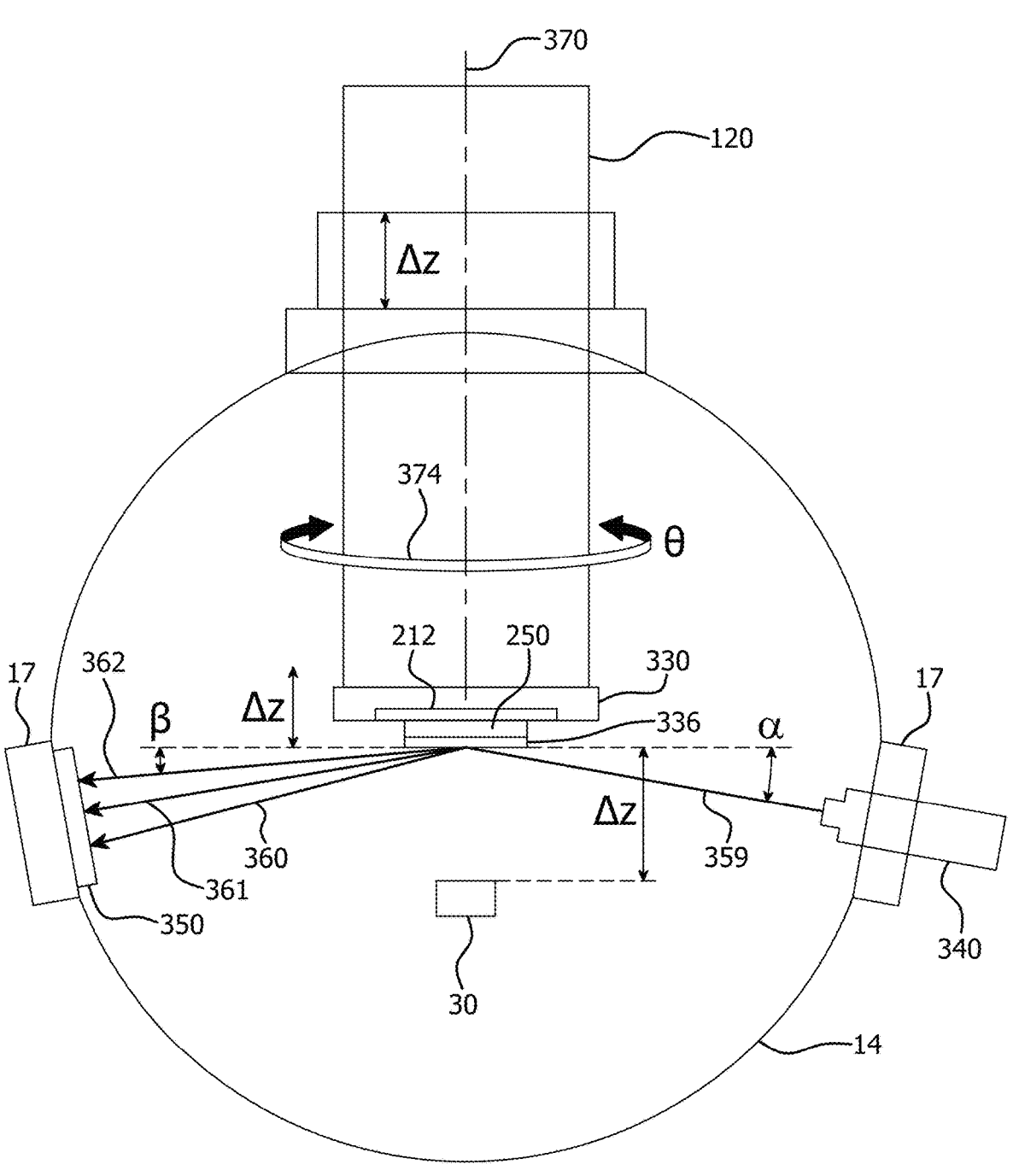
FIG. 23 is a schematic diagram of a diagnostic method for a physical vapor deposition process.

The heating laser beam of the invention can be used as part of a process to analyze the physical vapor deposition process. Such a process is shown schematically in FIG. 23. A fixture 330 can be placed on the end of the heating laser beam tube 120. Substrate securing plate 212 has thereon a substrate 250 and fits into fixture 330. A vacuum is drawn in the hermetic chamber 14 and a physical vapor deposition process is performed while the heating laser beam 300 heats the securing plate 212 in fixture 330 and thereby the substrate 250 while the target material 30 is vaporized and deposits on the substrate as a deposition layer 336.

The deposition layer 336 is then analyzed by the use of suitable analysis methods such as an electron beam source 340 and a detector 350. The electron beam source 340 and the detector 350 can be secured to the ports 17 of the hermetic chamber 14, or by other means. The electron beam 359 is directed at the deposition layer at an incident angle $\alpha$ and is scattered by the deposition layer 336 as beams 360-362 at angles $\beta$, and the scattered beams are detected by the detector 350. The motor 130 can be used to rotate the heating laser beam tube 120 an angle θ about the axis 370 of the heating laser beam tube 120 as shown by arrow 374 during this analysis of the substrate 250 and subsequently deposited layer 336. The motor 160 can be used to raise and lower the heating laser beam tube 120 and the deposition layer 336 a distance Δz, or between the deposition layer 336 and the electron beam. The signals from the detector 350 can be analyzed to determine the crystal structure of the deposition layer 336, and from this, optimal settings for the physical vapor deposition process can be determined. For example, the distance between the target 30 and the substrate 250 can be changed by a distance Δz, or the characteristics of the deposition such as target material, input energy, and the like can be altered, and the process repeated, until the deposition parameters have been optimized.

The invention permits the above analytics to be performed on the same or different platforms. For example, the substrate platform 204 and shield 260 can be removed and the diagnostics run with the electron beam source 340 and the detector 350. After the diagnostics are performed these items can be removed and replaced with the removable caps 18. It is also possible to have the motor 135, substrate platform 204 and heating laser beam tube 120 on one sealing support member 116 and utilize another sealing support member 116 for diagnostics with the motor 130, motor 160 and a heating laser beam tube 120.

The substrate exchange turret with laser heating of this invention alleviates workflow bottlenecks by allowing up to 10 substrates to be loaded into the deposition chamber at a time. The invention allows for an AI/ML algorithm to autonomously carry out up to 10 or more thin film growth experiments in a row before needing the assistance of a human, which increases the throughput of scientific experiments by greater than 10 times. From a commercial perspective, this invention can be applied to other types of PVD techniques (molecular beam epitaxy, magnetron sputtering, electron beam evaporation, etc.), making this a potentially useful product for PVD system manufacturers. Both science and industry can benefit from an increase in throughput.

The invention as shown in the drawings and described in detail herein disclose arrangements of elements of particular construction and configuration for illustrating preferred embodiments of structure and method of operation of the present invention. It is to be understood however, that elements of different construction and configuration and other arrangements thereof, other than those illustrated and described may be employed in accordance with the spirit of the invention, and such changes, alternations and modifications as would occur to those skilled in the art are considered to be within the scope of this invention as broadly defined in the appended claims. In addition, it is to be understood that the phraseology and terminology employed herein are for the purpose of description and should not be regarded as limiting.

We claim:

1. A physical vapor deposition system, comprising:
   (i) a hermetic chamber with an open interior and an access port;
   (ii) a heating laser source adapted to direct a laser beam into the open interior;
   (iii) a substrate holder assembly comprising a substrate platform positioned in the open interior and having a plurality of substrate securing stations, wherein the substrate securing stations comprise removable thermally conductive substrate securing plates, the substrate securing plates comprising a laser-contacting side and a substrate-securing side opposite to the laser-contacting side, the substrate being in contact with the substrate-securing side, wherein upon contact with a laser beam from the laser source the laser-contacting side will heat and will transfer heat to the substrate-securing side and the substrate, and a motor for moving the platform such that each of the substrate securing stations can be positioned to intercept the heating laser beam,
   wherein the substrate platform is configured as a wheel, wherein the wheel rotates about an axis that is parallel to the laser beam, wherein the wheel has a diameter and the access port has a diameter, and the diameter of the wheel is less than the diameter of the access port, and wherein the motor drives a transmission system to rotate the wheel;
   (iv) a shielding member for shielding a plurality of queued substrate securing stations from physical vapor deposition vapors, the shielding member comprising an opening for permitting a substrate secured to a substrate securing station that is aligned with the opening to be contacted by physical vapor deposition vapors;
   (v) a sealing support member for sealing the access port and supporting the substrate platform, the shielding member, and the transmission system within the hermetic chamber, the sealing support member being detachable from the access port, whereby the substrate platform, the shielding member, and the transmission system can be removed from the hermetic chamber in a single step by removing the sealing support member, and wherein the sealing support member comprises a laser transmissive portion aligned with the laser beam and the opening of the shielding member for permitting the laser beam to strike a substrate securing station aligned with the heating laser transmissive portion and the opening of the shielding member;
   (vi) a target assembly for retaining a target within the open interior; and
   (vii) a control system comprising a processor for controlling the operation of the heating laser beam and the motor.

2. The physical vapor deposition system of claim 1, wherein the substrate holder assembly is planar and the substrate securing stations are coplanar.

3. The physical vapor deposition system of claim 1, further comprising
   (viii) an energy source for energizing the target, the energy source comprising at least one selected from the group consisting of a pulsed or continuous wave laser; resistive heating element in boat, filament, or crucible form; cathodic arc; pulsed or continuous electron beam; RF, DC, pulsed, or ion beam sputtering; and RF or DC plasma discharge.

4. The physical vapor deposition system of claim 1, wherein the substrate securing plates comprise a thermal break opening.

5. The physical vapor deposition system of claim 1, wherein the substrate securing plates comprise a susceptor, a susceptor region when struck by the laser beam enhances translation of the energy of the laser beam to heat a substrate secured to the substrate securing plates.

6. The physical vapor deposition system of claim 1, further comprising
   (ix) a pyrometer for sensing the temperature of the substrate securing plates.

7. The physical vapor deposition system of claim 1, further comprising (x) an energy source for energizing a target held by the target assembly, whereby target material will be vaporized.

8. The physical vapor deposition system of claim 1, further comprising (xi) a heating laser beam tube, a motor for rotating the heating laser beam tube, and a motor for raising and lowering the heating laser beam tube.

9. The physical vapor deposition system of claim 8, further comprising (xii) an electron beam source and a detector.

\* \* \* \* \*